(12) United States Patent
Nishida et al.

(10) Patent No.: US 7,299,389 B2
(45) Date of Patent: Nov. 20, 2007

(54) TEST CIRCUIT, INTEGRATED CIRCUIT, AND TEST METHOD

(75) Inventors: Haruo Nishida, Sapporo (JP); Takuya Ishida, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 724 days.

(21) Appl. No.: 10/765,895

(22) Filed: Jan. 29, 2004

(65) Prior Publication Data
US 2004/0260992 A1 Dec. 23, 2004

(30) Foreign Application Priority Data
Jan. 30, 2003 (JP) ............... 2003-022235

(51) Int. Cl.
*G01R 31/28* (2006.01)
*G01R 31/26* (2006.01)
(52) U.S. Cl. ................... 714/724; 324/765
(58) Field of Classification Search ............ None
See application file for complete search history.

(56) References Cited

U.S. PATENT DOCUMENTS 5,940,414 A * 8/1999 Takano et al. .......... 714/733
6,180,426 B1 * 1/2001 Lin ...................... 438/15
6,586,266 B1 * 7/2003 Lin ...................... 438/15
2003/0199119 A1 * 10/2003 Lin ...................... 438/107
2005/0210347 A1 * 9/2005 Gossmann ............. 714/724

FOREIGN PATENT DOCUMENTS

JP          10246755 A    *  9/1998
JP     A 2001-183424           7/2001

OTHER PUBLICATIONS

U.S. Appl. No. 10/766,038, filed Jan. 29, 2004, Nishida et al.

* cited by examiner

*Primary Examiner*—Cynthia Britt
(74) *Attorney, Agent, or Firm*—Oliff & Berridge, PLC

(57) ABSTRACT

A test circuit comprises a selector SEL1 having a first input to which signals M1OUT from a macro block MB1 are input and a second input to which test input signals TIN1 and TIN2 for a macro block MB2 are input, and a selector SEL2 having a first input to which a signal SQ from the SEL1 is input and a second input to which a signal M2OUT from the MB2 is input. In a first test mode in which the MB1 is tested, the SEL1 outputs the signals M1OUT from the MB1 to a first input of the SEL2, and the SEL2 outputs the signal SQ from the SEL1 to the MB1. In a second test mode in which the MB2 is tested, the SEL1 outputs the test input signals TIN1 and TIN2 for the MB2 to the MB2, and the SEL2 outputs the signals M2OUT from the MB2 as a test output signal TOUT for the MB2.

13 Claims, 16 Drawing Sheets

FIG. 3A  FIRST TEST MODE
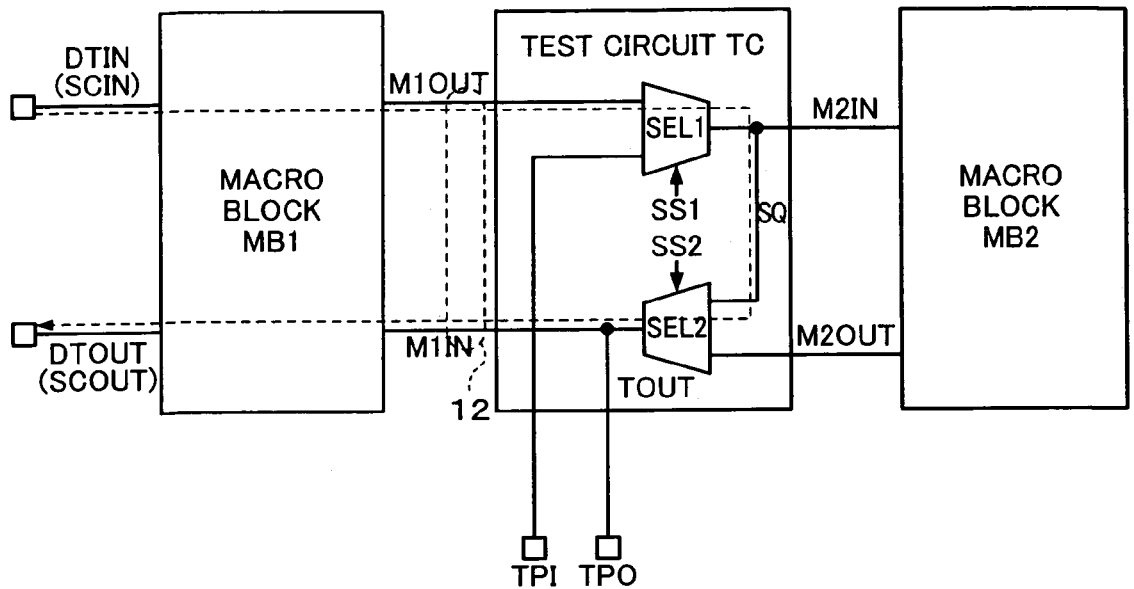
FIG. 3B  SECOND TEST MODE
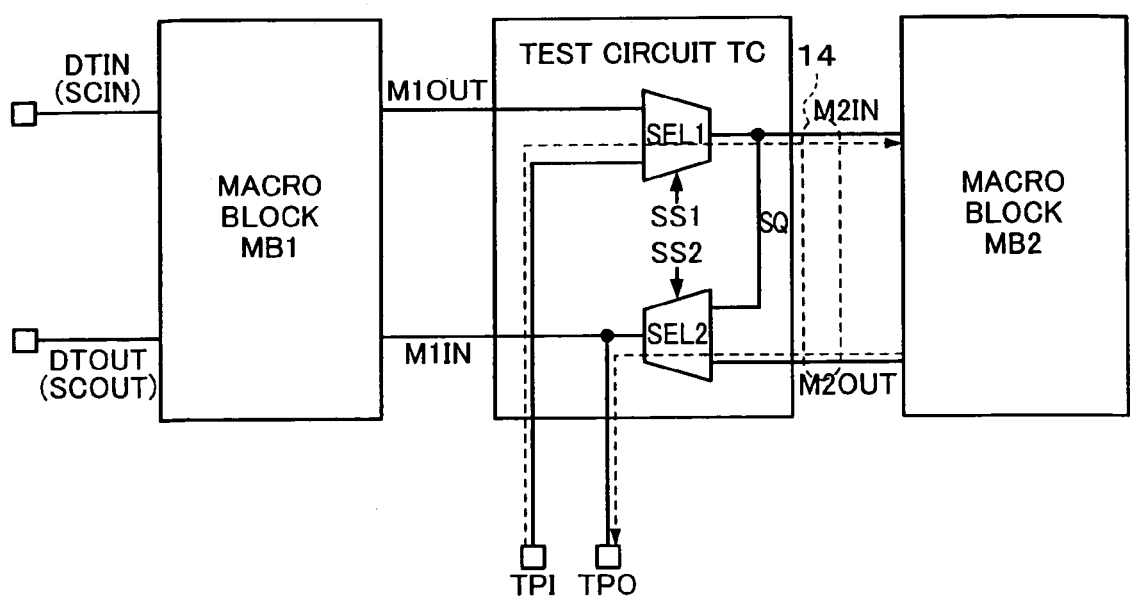

FIG. 10

| TAD | TRD/TWR | Bit3 | Bit2 | Bit1 | Bit0 |
|---|---|---|---|---|---|
| 0x0 | W | TxBuf0[7] | TxBuf0[6] | TxBuf0[5] | TxBuf0[4] |
| 0x0 | R | RxBuf0[7] | RxBuf0[6] | RxBuf0[5] | RxBuf0[4] |
| 0x1 | W | TxBuf0[3] | TxBuf0[2] | TxBuf0[1] | TxBuf0[0] |
| 0x1 | R | RxBuf0[3] | RxBuf0[2] | RxBuf0[1] | RxBuf0[0] |
| 0x2 | W | TxBuf1[7] | TxBuf1[6] | TxBuf1[5] | TxBuf1[4] |
| 0x2 | R | RxBuf1[7] | RxBuf1[6] | RxBuf1[5] | RxBuf1[4] |
| 0x3 | W | TxBuf1[3] | TxBuf1[2] | TxBuf1[1] | TxBuf1[0] |
| 0x3 | R | RxBuf1[3] | RxBuf1[2] | RxBuf1[1] | RxBuf1[0] |
| 0x4 | W | TxBuf2[7] | TxBuf2[6] | TxBuf2[5] | TxBuf2[4] |
| 0x4 | R | RxBuf2[7] | RxBuf2[6] | RxBuf2[5] | RxBuf2[4] |
| 0x5 | W | TxBuf2[3] | TxBuf2[2] | TxBuf2[1] | TxBuf2[0] |
| 0x5 | R | RxBuf2[3] | RxBuf2[2] | RxBuf2[1] | RxBuf2[0] |
| 0x6 | W | TxBuf3[7] | TxBuf3[6] | TxBuf3[5] | TxBuf3[4] |
| 0x6 | R | RxBuf3[7] | RxBuf3[6] | RxBuf3[5] | RxBuf3[4] |
| 0x7 | W | TxBuf3[3] | TxBuf3[2] | TxBuf3[1] | TxBuf3[0] |
| 0x7 | R | RxBuf3[3] | RxBuf3[2] | RxBuf3[1] | RxBuf3[0] |
| 0x8 | R/W | - | - | TXMODE | - |
| 0x9 | R/W | XCVRSELECT | TERMSELECT | OPMODE1 | OPMODE0 |
| 0xA | R/W | PLLSELECT | OSCENB | CLKSELECT1 | CLKSELECT0 |
| 0xB | R/W | RESET | RAWCLOCK | ANA_IQ | SUSPEND |
| 0xC | R/W | OPENLOOP | TglCLK | DivideCLK | MonCLK(R) |
| 0xD | R | MonRXACTIVE | MonRXERROR | MonLINESTATE1 | MonLINESTATE0 |
| 0xE | R/W | - | - | MonRXERROR(R) | LatRXERROR |
| 0xF | R/W | - | - | - | TXSTART |

TEST CIRCUIT, INTEGRATED CIRCUIT, AND TEST METHOD

Japanese Patent Application No. 2003-22235, filed on Jan. 30, 2003, is hereby incorporated by reference in its entirety.

BACKGROUND OF THE INVENTION

The present invention relates to a test circuit, an integrated circuit, and a test method.

Recently, as integrated circuits have become larger, attempts to detect faults (such as wiring defects or element defects) in the entire circuit comprising such integrated circuits have run into problems in that the test pattern has become more complicated, and thus the development of such a test pattern is taking longer and is more expensive. A test method called a scan method is known as a means of solving this problem, as disclosed in Japanese Patent Application Laid-Open No. 2001-183424.

With this scan method, after the logic design has been completed and a net list of the circuit has been created, scan flip-flops (scanner circuits) are inserted into the circuit (net list). More specifically, flip-flops (hereinafter abbreviated to FF) within the circuit are replaced by scan FFs. A net list of these scan FFs is then used to perform fault simulations and create (automatically generate) a text pattern. This test pattern is used to test trial products or mass-produced products.

However, even when this scan method is used, it is becoming difficult to create the test pattern and improve the fault detection rate with large-scale integrated circuits. In particular, a method of integrated circuit design that has recently become popular is to form circuits with specific functions into blocks, then connect together macro blocks (macro cells) that are circuit blocks formed in this manner. For example, it is possible to design an integrated circuit (ASIC) for a specific purpose involving the USB 2.0 function, by connecting together a macro block that conforms to the USB 2.0 Transceiver Macrocell Interface (UTMI) specification, a circuit (serial interface engine) that controls that UTMI block, and a user-customized circuit. In such a case, it is comparatively simple to create a test pattern for each of these macro blocks, but a technical problem occurs in that it is not simple to create a test pattern for detecting faults (wiring defects) in the connecting portions between the macro blocks.

A further technical problem is caused by the huge number of terminals (pins) involved with integrated circuits, making it necessary to reduce that number as far as possible. It is therefore preferable to minimize the number of test terminals as far as possible.

BRIEF SUMMARY OF THE INVENTION

According to one aspect of the present invention, there is provided a test circuit for an integrated circuit comprising a plurality of macro blocks, the test circuit comprising:

a first selector having a first input to which an output signal from a first macro block is input and a second input to which a test input signal for a second macro block is input; and a second selector having a first input to which an output signal from the first selector is input and a second input to which an output signal from the second macro block is input, wherein during a first test mode for testing the first macro block, the first selector outputs to the first input of the second selector the output signal that has been input from the first macro block to the first input of the first selector, and the second selector outputs to the first macro block the output signal that has been input from the first selector to the first input of the second selector, and wherein during a second test mode for testing the second macro block, the first selector outputs to the second macro block the test input signal for the second macro block that has been input to the second input of the first selector, and the second selector outputs the output signal from the second macro block that has been input to the second input of the second selector, as a test output signal for the second macro block.

According to another aspect of the present invention, there is provided a test method that uses a test circuit comprising a first selector having a first input to which an output signal from a first macro block is input and a second input to which a test input signal for a second macro block is input, and a second selector having a first input to which an output signal from the first selector is input and a second input to which an output signal from the second macro block is input, wherein during a first test mode for testing the first macro block, the output signal from the first macro block that has been input to the first input of the first selector is output to the first input of the second selector, and the output signal from the first selector that has been input to the first input of the second selector is output to the first macro block, and wherein during a second test mode for testing the second macro block, the test input signal for the second macro block that has been input to the second input of the first selector is output to the second macro block, and the output signal from the second macro block that has been input to the second input of the second selector is output as a test output signal for the second macro block.

BRIEF DESCRIPTION OF THE SEVERAL VIEWS OF THE DRAWING

FIGS. 3A and 3B are illustrative of an operation of the test circuit;

FIG. 10 shows an example of a buffer address map;

DETAILED DESCRIPTION OF THE EMBODIMENT

One embodiment is described below. Note that the embodiment described below does not in any way limit the scope of the present invention defined by the claims laid out herein. In addition, the overall configuration of the embodiments below should not be taken as limiting the subject matter defined by the claims herein.

1. Detection of Faults in Connecting Portions Between Macro Blocks

Figure 1A:
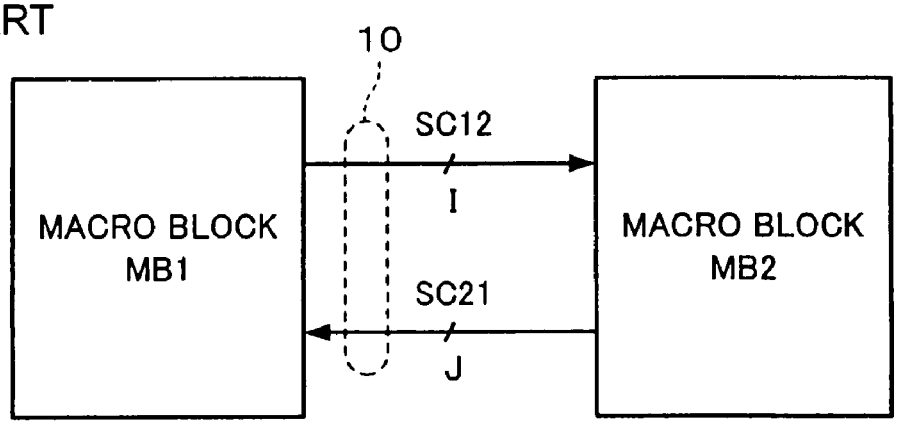
FIGS. 1A and 1B are illustrative of a method of testing an integrated circuit that comprises macro blocks.

An example of an integrated circuit formed by connecting together a plurality of macro blocks MB1 and MB2 (macro cells or circuit blocks) is shown in FIG. 1A. To detect faults in such an integrated circuit, it is possible to use a known scan method to set a scan path to MB1, for fault detection within the macro block MB1 as shown by way of example in FIG. 1B. To detect faults within the macro block MB2, it is possible to input test input signals TIN from test input terminals (pins) TPI and output test output signals TOUT that are the results of those tests from test output terminals TPO, by way of example.

Figure 1B:
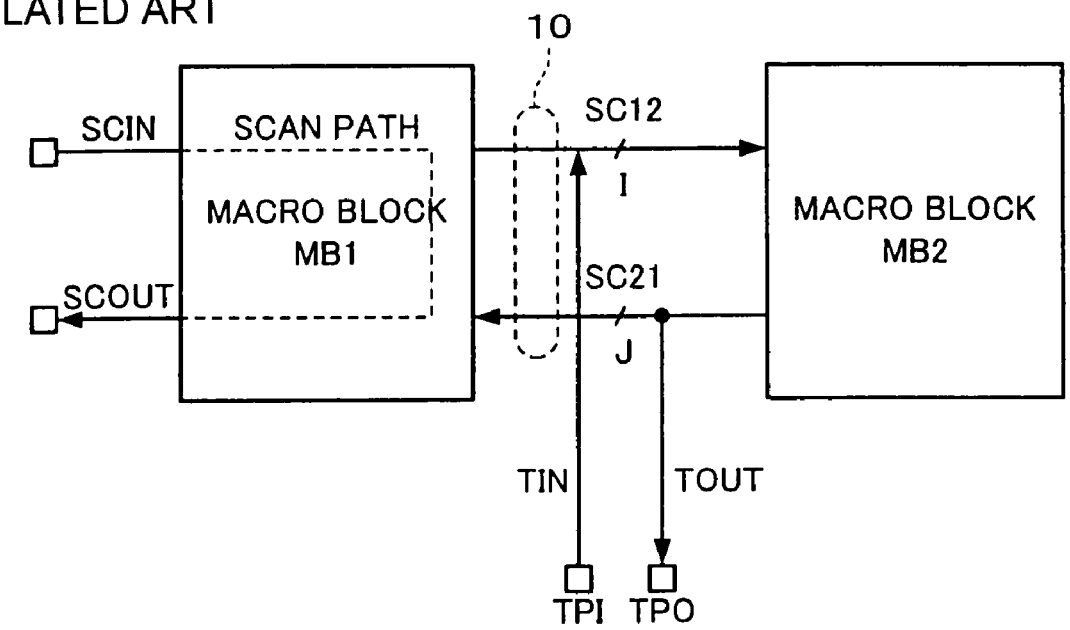

However, the method shown in FIG. 1B has a technical problem in that it is difficult to detect faults in a connecting portion 10 (the wiring for I signals SC12 and J signals SC21). In other words, it is difficult to create a test pattern that can achieve a fault detection rate of at least 90 percent in the connecting portion 10 (the signals SC12 and SC21), even if the scan path to the macro block MB1 is tested. For that reason, the development of a test pattern tends to be time-consuming and expensive.

Since the method of FIG. 1B necessitates the provision of (I+J) test terminals TPI and TPO, the number of terminals increases, leading to an increase in the cost of the integrated circuit. In such a case, it is desirable to implement a test circuit that enables a simplification of fault detection in the connecting portion 10 between the macro blocks MB1 and MB2.

2. Test Circuit

Figure 2:
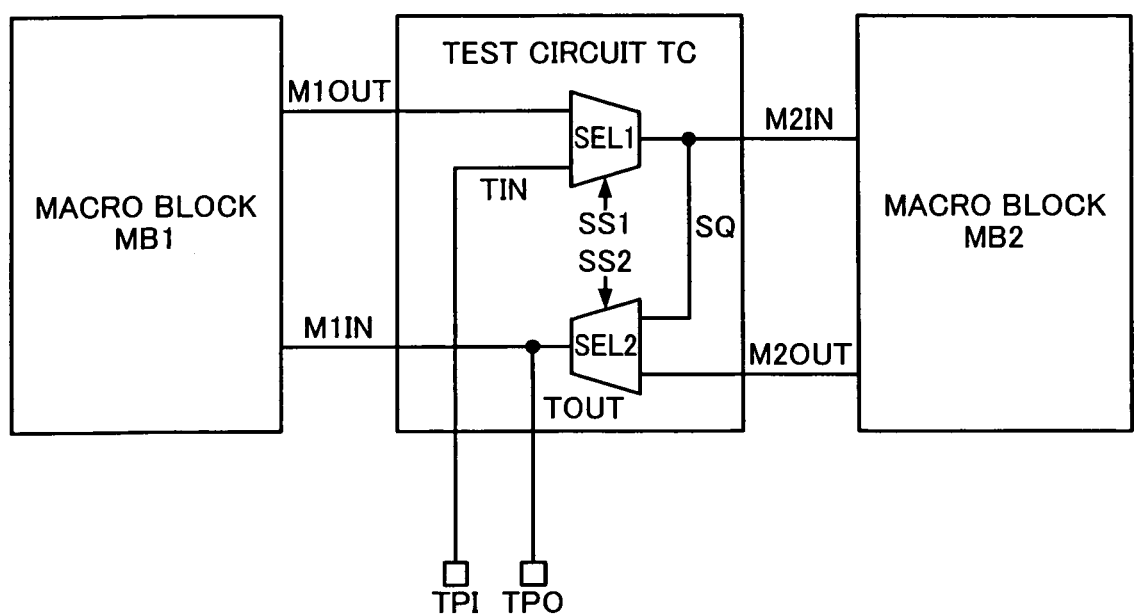
FIG. 2 shows an example of a configuration of a test circuit in accordance with an embodiment of the present application.

An example of the configuration of a test circuit TC in accordance with this embodiment, and an integrated circuit comprising the same, is shown in FIG. 2. Note that the test circuit TC and integrated circuit of this embodiment need not necessarily comprise all the structural components shown in FIG. 2; some of them could be omitted. In addition, the integrated circuit of this embodiment could also comprise three or more macro blocks.

The macro blocks MB1 and MB2 shown in FIG. 2 are circuit blocks having circuits that have one or more functions (such as a communications circuit, a circuit for controlling such a communications circuit, a circuit for interfacing with a bus, RAM, a CPU, a DSP, a liquid-crystal driver, a CCD controller, or a user-customized circuit).

More specifically, MB2 could be a macro block for communications which comprises physical-layer circuit for communications, by way of example; even more specifically, it could be a macro block that conforms to the UTMI specifications (a specific interface standard). MB1 could be a macro block comprising a circuit (SIE) for controlling MB2, a buffer, an interface circuit, or a user-customized circuit, by way of example. In other words, MB1 is a macro block configured by a logic circuit and MB2 is a macro block that comprises an analog circuit such as a physical-layer circuit for communications.

The test circuit TC comprises a selector SEL1 (a first selector). In this case, SEL1 has a first input to which output signals M1OUT from MB1 (the first macro block) are input. The test input signal TIN for MB2 (the second macro block) is input to a second input thereof. The selection operation of this SEL1 is controlled by a select signal SS1.

The test circuit TC also comprises a selector SEL2 (a second selector). In this case, an output signal SQ from SEL1 is input to a first input of SEL2. Output signals M2OUT from MB2 are input to a second input thereof. The selection operation of this SEL2 is controlled by a select signal SS2.

In a first test mode for testing MB1 (such as a scan mode), the selector SEL1 selects a number of the output signals M1OUT (such as I signals) from MB1 that are input to the first input thereof, and outputs the resultant output signal SQ to the first input of SEL2, as shown in FIG. 3A. The SEL2 outputs the output signal SQ from the selector SEL1, which is input to the first input thereof, to MB1 as a number of input signals M1IN (such as J signals). In this first mode, a test pattern signal (logic test pattern) is input from a terminal DTIN (such as a data input terminal or scan-in terminal SCIN), as shown in FIG. 3A. The test is done by comparing the result that is output from a terminal DTOUT (such as a data output terminal or a scan-out terminal SCOUT) with an expected value.

As shown in FIG. 3B, in a second test mode for testing MB2, on the other hand, SEL1 takes a number of the test input signals TIN (such as I signals) for MB2, which are input to the second input thereof, and outputs them to MB2 as a number of input signals M2IN (such as I signals). In addition, SEL2 takes a number of the output signals M2OUT (such as J signals) from MB2, which are input to the second input thereof, and outputs them as test output signals TOUT for MB2. In this second test mode, test input signals (a logic test pattern and a transmission data signal) are input from terminals TPI. Test output signals (the results of the logic test pattern and a reception data signal) that are output from terminals TPO are compared with expected values and are inspected.

Note that in an ordinary operating mode that is not the first and second test modes (a mode in which the integrated circuit operates in a normal manner), the output signals M1OUT from the macro block MB1 are input through the selector SEL1 to the macro block MB2 as the input signals M2IN to the macro block MB2. The output signals M2OUT from the macro block MB2 are input through the selector SEL2 to the macro block MB1 as the input signals M1IN to the macro block MB1.

The test input signals TIN could be signals that are input through a buffer or the like to test input terminals TPI, or they could be signals that are output from a circuit that is not shown in the figure (such as the communications sequencer that will be described later). Similarly, the test output signals TOUT could be output through a buffer or the like to the test output terminals TPO, or they could be output to a circuit that is not shown in the figure (such as the communications sequencer).

The test circuit TC of this embodiment shown in FIG. 2 makes it possible to detect faults (wiring defects) in a connecting portion 12 between the macro block MB1 and the test circuit TC, using the first test mode shown in FIG. 3A. It is also possible to detect faults in a connecting portion 14 between the test circuit TC and the macro block MB2 in the second test mode shown in FIG. 3B. As a result, this makes it possible to detect faults in the connecting portion 10 between the macro blocks MB1 and MB2 of FIG. 1.

Moreover, the test pattern for detecting faults in the connecting portion 12 by the first test mode of FIG. 3A can be creates in a comparatively simple manner (automatic generation). It is also simple to detect faults in the connecting portion 14 by the second test mode of FIG. 3B. In addition, the use of the test input signals TIN and the test output signals TOUT makes it possible to simplify these tests, even when the macro block MB2 comprises analog circuits such as a physical-layer circuit for communications. This embodiment therefore makes it, possible to shorten the test pattern development period and reduce the cost thereof, and also increase the fault detection ratio and thus improve the reliability of the integrated circuit.

3. Scan Method

It is desirable that the first test mode of FIG. 3A is a scan mode in which testing is done by a scan method. As shown by way of example in FIG. 4, a scan path is set up, not only for the macro block MB1 but also for the test circuit TC. In other words, not only flip-flops within the macro block MB1 but also flip-flops within the test circuit TC are replaced by scan FFs (scan circuits), and a scan path (a scan chain) linking those scan FFs is created. In other words, the macro block MB1 and the test circuit TC are viewed as a single macro block MB12 and a known scan tester tool is used to insert scan FFs into the net list for MB12 (setting a scan path).

Figure 5A:
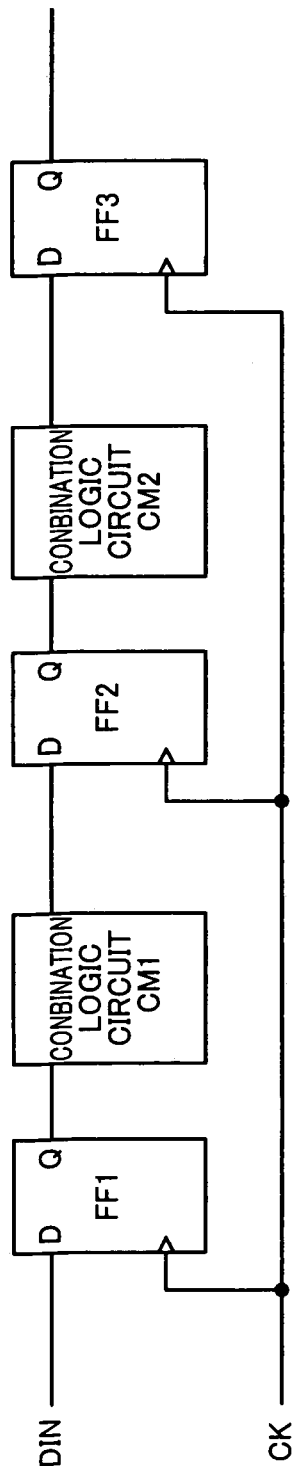
FIGS. 5A and 5B are illustrative of the scan method.
Figure 5B:
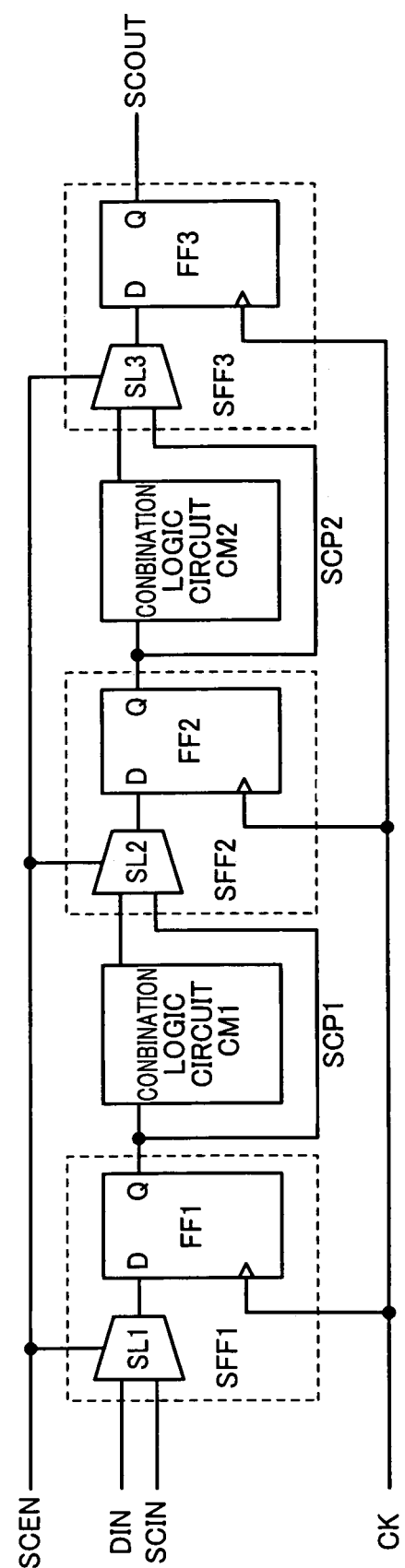

A circuit comprising flip-flops FF1, FF2, and FF3 and conbination logic circuits CM1 and CM2 is shown by way of example in FIG. 5A. When this circuit is tested by the scan method, the flip-flops FF1, FF2, and FF3 are replaced by scan flip-flops SFF1, SFF2, and SFF3 that have selectors SL1, SL2, and SL3, as shown in FIG. 5B. Scan paths SCP1 and SCP2 are provided to bypass the ordinary paths through the conbination logic circuits CM1 and CM2.

First of all, a scan enable signal SCEN is set to a first level (such as high level) and a scan path side (the SCIN side) is selected in the selectors SL1, SL2, and SL3. A test pattern signal is input sequentially in series from the scan-in terminal SCIN to set a test pattern signal with respect to the flip-flops FF1, FF2, and FF3.

The scan enable signal SCEN is then set to a second level (such as low level) and an ordinary path side is selected in the selectors SL1, SL2, and SL3. A clock signal CK is made active for one clock pulse, by way of example, and output signals from the flip-flops FF1 and FF2 are input to the combined circuits CM1 and CM2 and also output signals from CM1 and CM2 are held in FF2 and FF3.

The scan enable signal SCEN is then set to the first level, to select the scan path side (SCIN side) in the selectors SL1, SL2, and SL3. A test result signal that is held in the flip-flops FF1, FF2, and FF3 is output serially from the scan-out terminal SCOUT through the scan paths SCP1 and SCP2, for comparison with an expected value. This makes it possible to test for element defects in the flip-flops FF1, FF2, and FF3 and conbination logic circuits CM1 and CM2, as well as wiring defects in the circuit therebetween.

Figure 6:
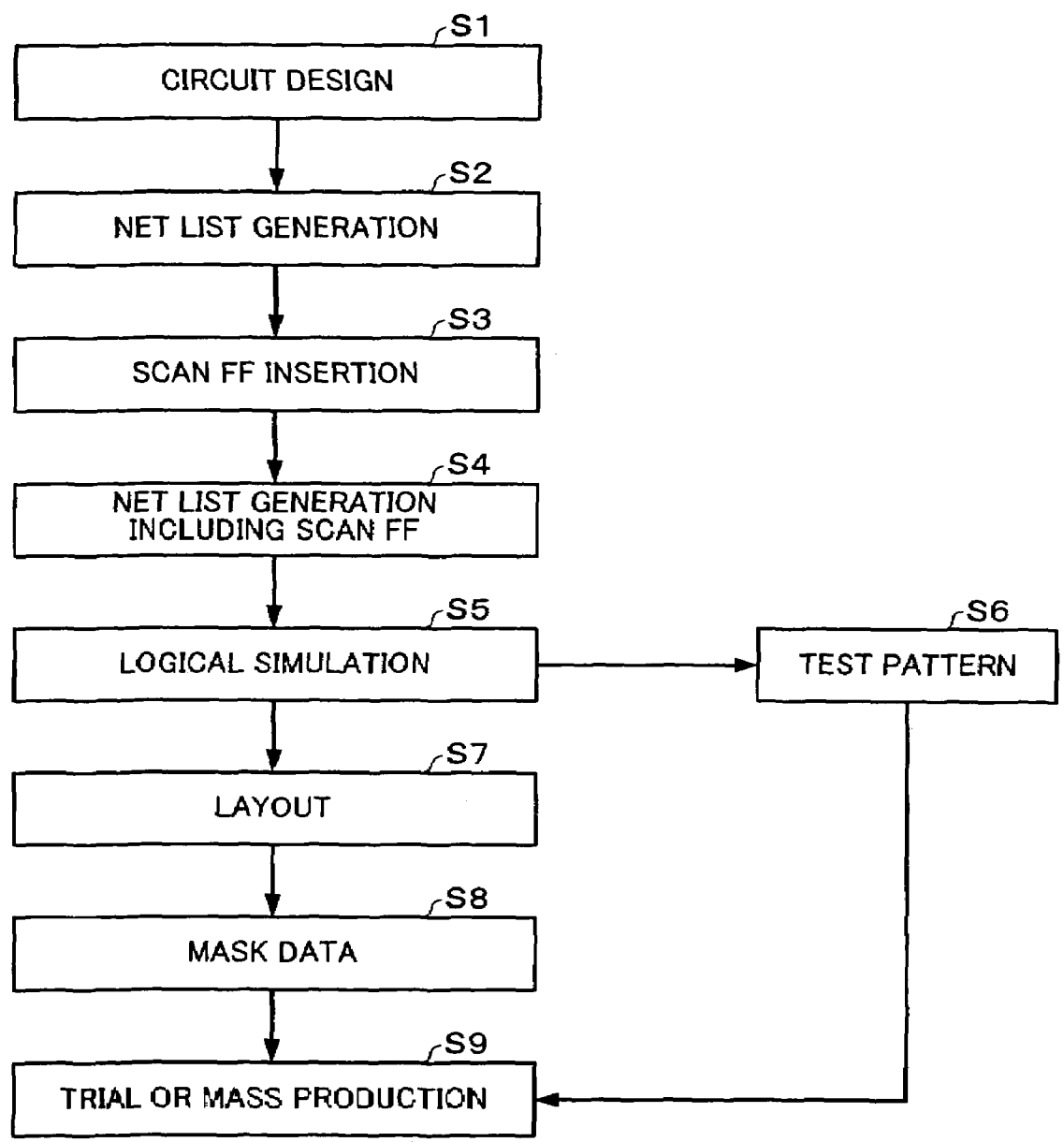
FIG. 6 is a flowchart of a test method that utilizes the scan method.

A flowchart of a test method using the scan method is shown in FIG. 6. First of all, the circuit is designed and a net list of the designed circuit is created (steps S1 and S2). A known scan tester tool is then used to insert scan FFs into the designed circuit and a net list comprising the scan FFs is created (steps S3 and S4). A logic simulation is performed, using the net list that comprises the scan FFs, and a test pattern is created (automatic generation) (steps S5 and S6). The circuit is subsequently laid out and mask data is generated (steps S7 and S8). The test pattern created (automatically generated) in step S6 is used for testing trial products or mass-produced products (step S9).

Use of the above-described scan method increases the size of the macro block slightly, but it enables a simplification of the generation of test patterns and an increase in the fault detection rate, because it makes it possible to cut out the conbination logic circuits between the scan FFs and thus perform partial testing.

Figure 4:
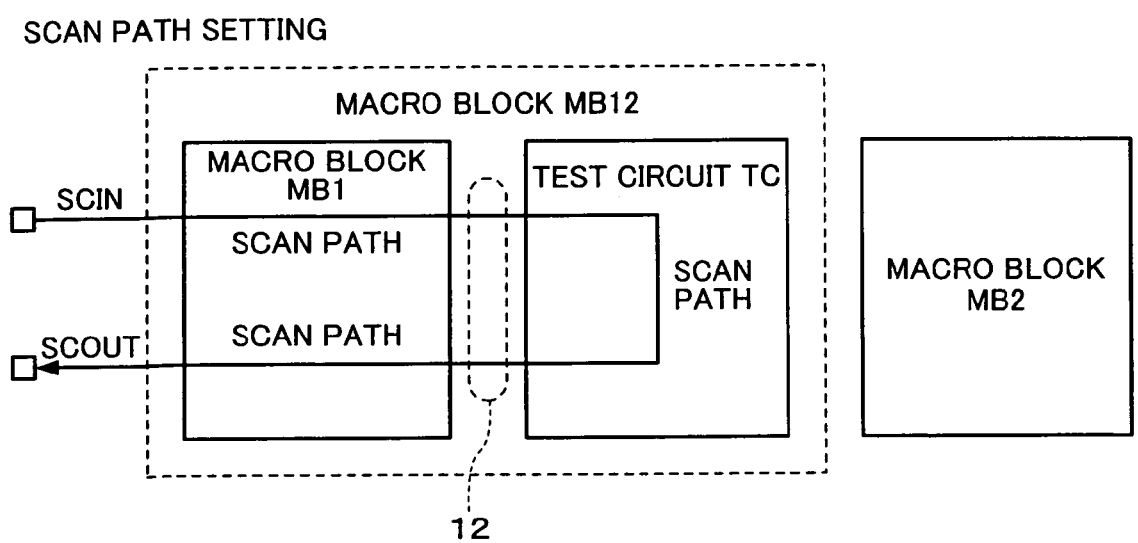
FIG. 4 is illustrative of a method of setting the scan paths for a macro block and the test circuit.

With this embodiment, the macro block MB1 and the test circuit TC are viewed as a single macro block MB12, as shown in FIG. 4, and a scan path from the scan-in terminal SCIN to the scan-out terminal SCOUT is set for the macro block MB1 and the test circuit TC (a scan FF is inserted). It therefore becomes simple to create a test pattern that enables the detection of faults (wiring defects) in the connecting portion 12 between the macro block MB1 and the test circuit TC, at a high fault detection rate. This makes it possible to reduce the test pattern development period, at a lower cost.

4. Dummy Scan Flip-Flops

Figure 7:
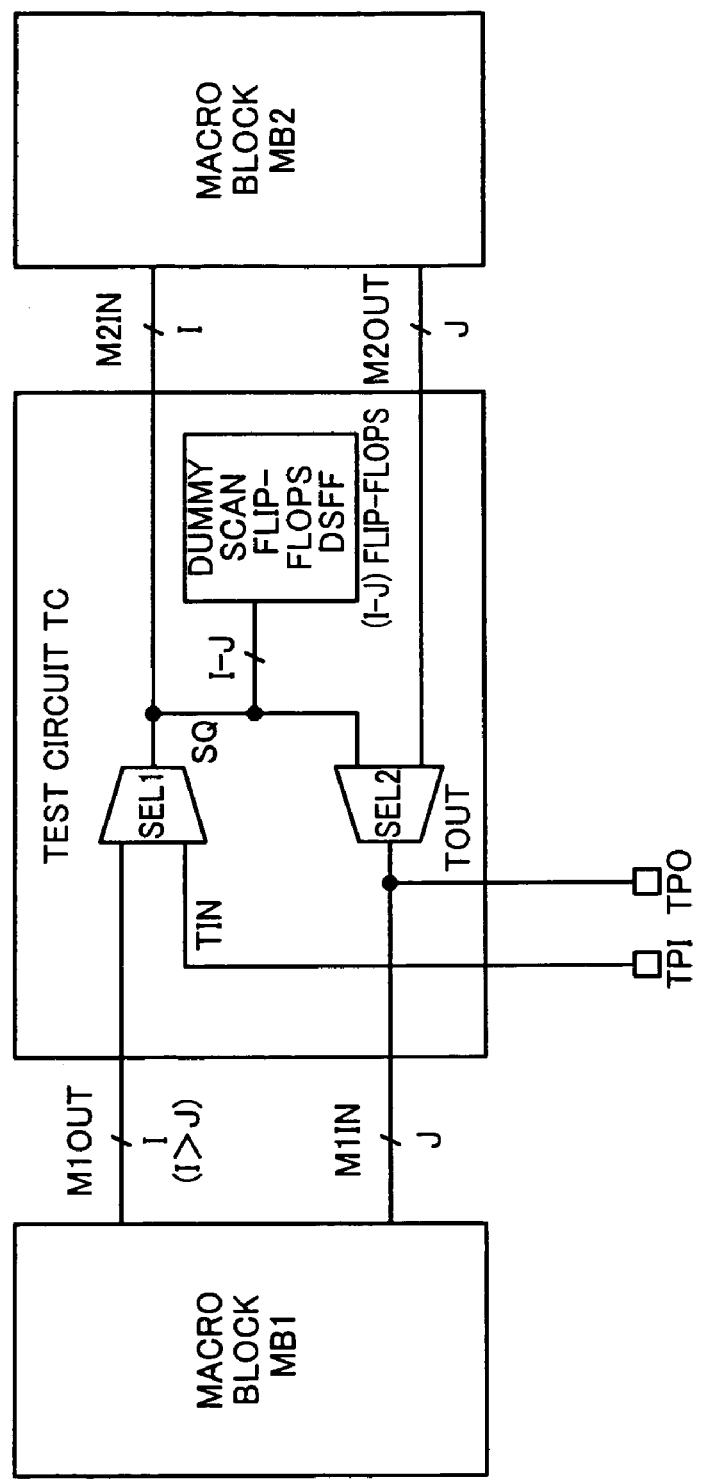
FIG. 7 shows an example of a test circuit that comprises a dummy scan FF.

With this embodiment, one or a plurality of dummy scan flip-flops DSFF could be comprised within the test circuit TC, as shown in FIG. 7.

As shown by way of example in FIG. 7, the number of output signals M1OUT from the macro block MB1 is I and the number of input signals from the test circuit TC to MB1 is J (where I>J, and I and J are each a natural number or an integer greater than or equal to two). In other words, the number of output signals M1OUT is greater than the number of input signals M1IN. To implement the method of FIG. 4 of setting an integrated scan path for the test circuit TC and the macro block MB1 when there is a difference in the numbers of signals in this manner, one or a plurality of dummy scan flip-flops DSFF is comprised within the test circuit TC as shown in FIG. 7.

More specifically, (I−J) dummy scan flip-flops DSFF are provided in the test circuit TC to hold (I−J) output signals (the Jth to Ith output signals) of the I output signals (first to Ith output signals). In the scan mode described with reference to frequency (the first test mode), the configuration is such that the dummy scan flip-flops DSFF output the held output signals through the scan path (the path from the scan-in terminal, through the scan flip-flops, to the scan-out terminal). In other words, the DSFFs hold signals that have been input from the scan flip-flops of the previous stage, then output the held signals to the scan flip-flops in the subsequent stage.

Figure 8A:
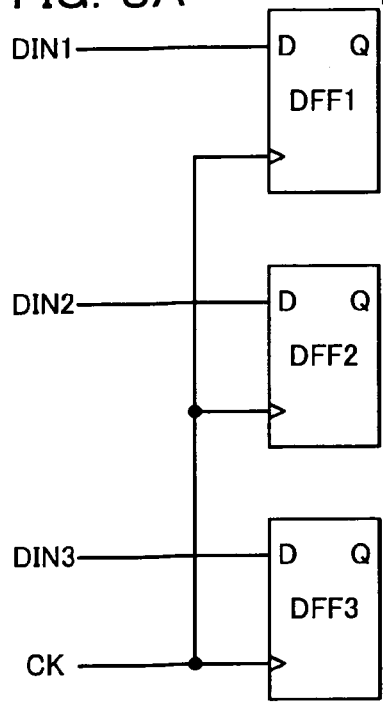
FIGS. 8A, 8B, and 8C are illustrative of the dummy scan FF.

For example, the three (generally speaking: (I−J)) dummy flip-flops DFF1, DFF2, and DFF3 shown in FIG. 8A are comprised within the net list created at step S2 in FIG. 6. (I−J) output signals DIN1, DIN2, and DIN3 (the Jth to Ith output signals) of the I output signals from the selector SEL1 are connected to data terminals D of DFF1, DFF2, and DFF3.

Figure 8B:
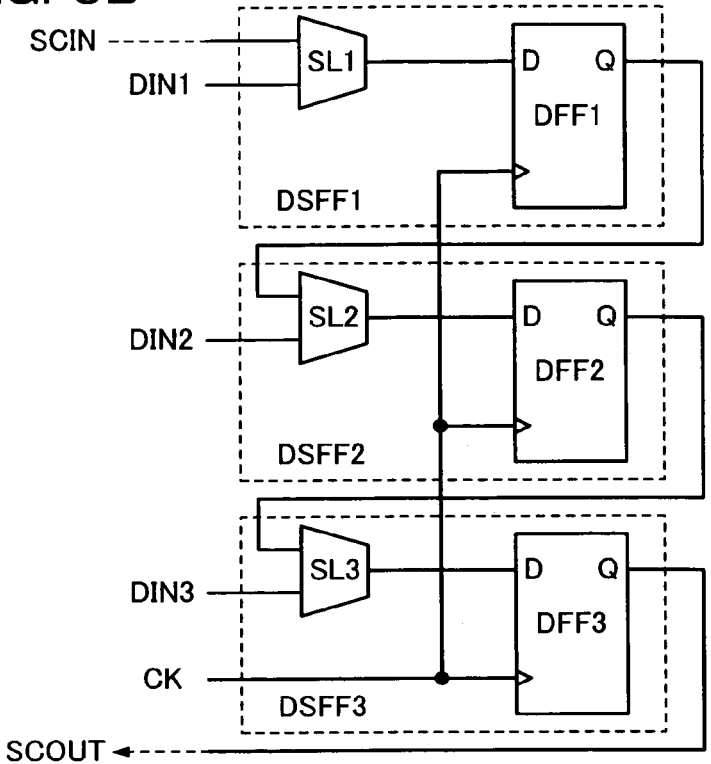

The scan method described at steps S4 and S5 of FIG. 6 replaces DFF1, DFF2, and DFF3 in the net list with the dummy scan flip-flops DSFF1, DSFF2, and DSFF3 of FIG. 8B (dummy flip-flops that are meaningless in the ordinary operating mode and are disabled therein).

During the scan mode, the DIN side is selected for SL1, SL2, and SL3, and signal DIN1, DIN2, and DIN3 (the (I−J) output signals of the scan flip-flops of the selector SEL1 or the stage after SEL1) are held in DFF1, DFF2, and DFF3.

Subsequently, the SCIN side is selected for SL1, SL2, and SL3, and the signals DIN1, DIN2, and DIN3 held in DFF1, DFF2, and DFF3 (DSFF1 to DSFF3) are output serially from SCIN, through the scan path to SCOUT.

Figure 8C:
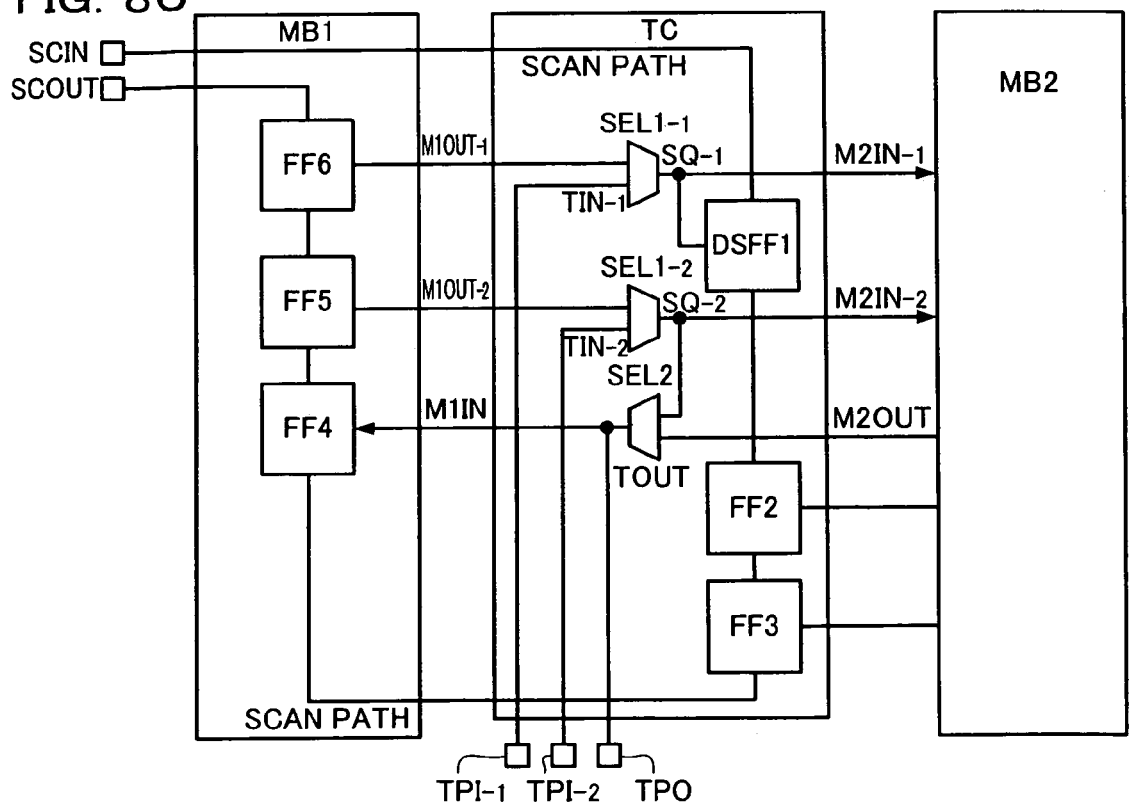

The situation of the scan path that is set for the macro block MB1 and the test circuit TC is shown schematically in FIG. 8C. As shown by way of example in FIG. 8C, since there are two (I) output signals M1OUT-1 and M1OUT-2 from MB1 to TC and one input signal from TC to MB1, one (I−J) dummy scan flip-flop DSFF1 is provided.

The output signal M1OUT-1 from a flip-flop FF6 within MB1 is input to the first input of SEL1-1 (a first selector) and a test input signal TIN-1 from a test input terminal TPI-1 is input to the second input thereof. An output signal SQ-1 of SEL1-1 is input to the dummy scan flip-flop DSFF1 provided within TC.

Similarly, the output signal M1OUT-2 from a flip-flop FF5 within MB1 is input to the first input of SEL1-2 (another first selector) and a test input signal TIN-2 from a test input terminal TPI-2 is input to the second input thereof. An output signal SQ-2 of SEL1-2 is input to the data terminal of the flip-flop FF2 provided within TC.

The output signal SQ-2 from SEL1-2 is also input to the first input of SEL2 (the second selector) and the output signal M2OUT from MB2 is input to the second input thereof. The output signal TOUT from SEL2 is output to the test output terminal TPO, or to a flip-flop FF4 within MB1.

In the scan mode, the signals (values) held in DSFF1, FF2, FF3, FF4, FF5, and FF6 through the scan path from SCIN to SCOUT are output in series from SCOUT, enabling the implementation of testing by this scan method.

The above-described configuration makes it possible to detect wiring defects in the remaining (I−J) signals M2OUT by the scan method described with reference to FIG. 4, even when the number I of signals M1OUT is greater than the number J of signals M1IN, as shown in FIG. 7. In other words, these (I−J) signals can be output along the scan path from SCIN, through MB1 and TC, to SCOUT when in scan mode. As a result, it is possible to detect faults more reliably.

Note that the dummy flip-flops DFF1, DFF2, and DFF3 before the substitution for scan flip-flops have nothing connected to Q terminals thereof in FIG. 8A. There is a possibility that these flip-flops DFF1, DFF2, and DFF3 with nothing connected to the Q terminals could be perceived as disabled flip-flops and deleted, depending on the specifications of the net list creation tool. To prevent such a situation, therefore, the Q terminals of DFF1, DFF2, and DFF3 could be connected to nodes that have no adverse effect on ordinary operation (such as nodes of the test buffer that will be described later).

5. Detailed Example 5.1 Overall Configuration

Figure 9:
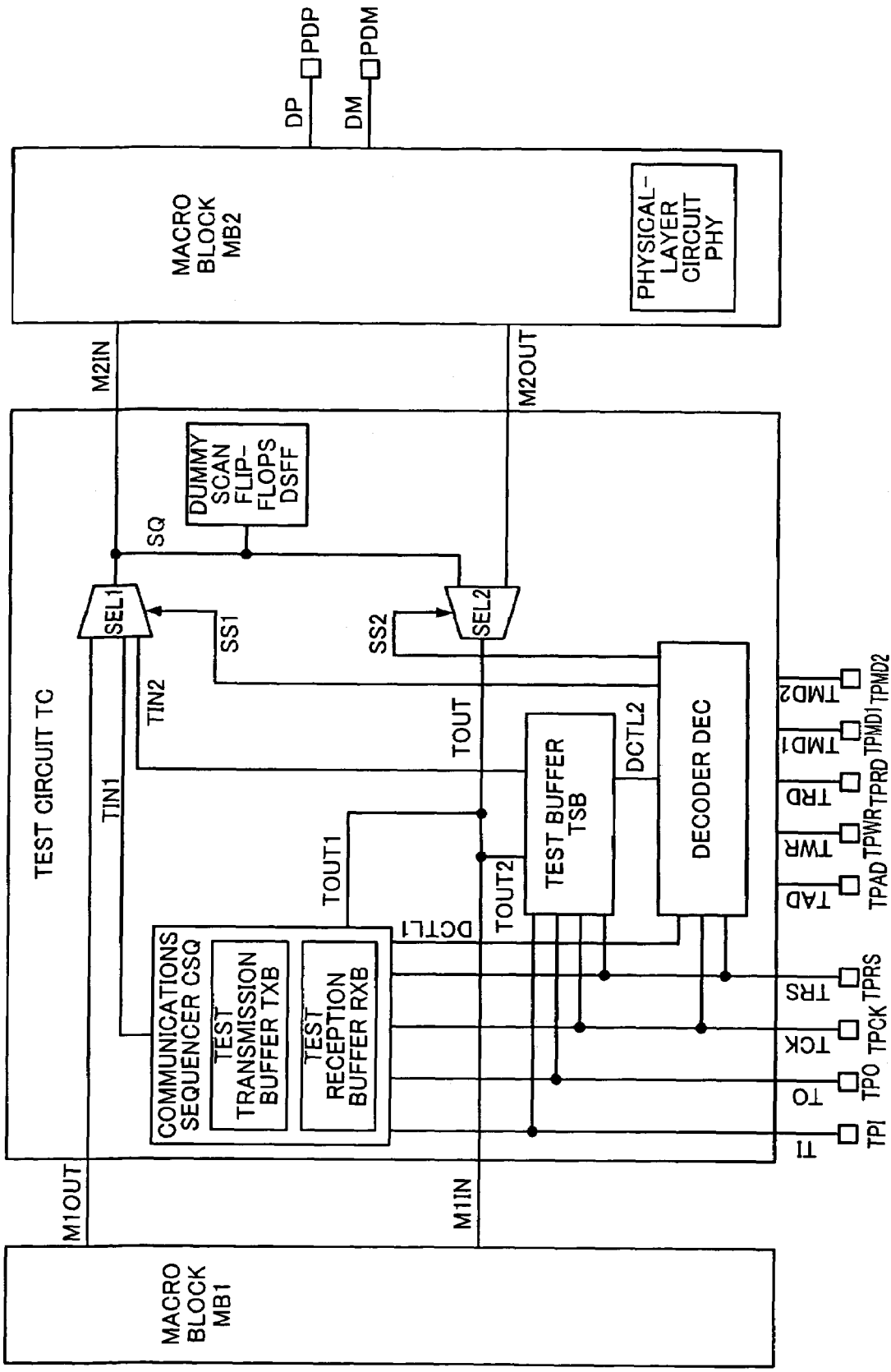
FIG. 9 shows a detailed example of a test circuit in accordance with this embodiment.

A detailed example of the configuration of the test circuit TC is shown in FIG. 9. Note that the test circuit of this embodiment need nor necessarily comprise all of the structural components shown in FIG. 9; some of them could be omitted.

In FIG. 9, TPI denotes a test input terminal and TPO denotes a test output terminal. Similarly, TPCK denotes a test clock terminal and TPRS denotes a reset terminal. TPAD, TPWR, and TPRD denote an address terminal, a write terminal, and a read terminal for the buffer (register). TPMD1 and TPMD2 denote test mode terminals. PDP and PDM denote terminals for differential signals DP and DM (data positive and data negative) as defined under USB.

MB2 in FIG. 9 denotes a macro block that comprises a physical-layer circuit PHY for data communications. This MB2 is a macro block such as one that conforms to the UTMI specifications (generally speaking: communications macro block specifications). Note that this macro block MB2 also has functions for receiving a transmission data signal that has be transmitted over USB by using DP and DM, as a received data signal in loopback mode.

The test circuit TC comprises a communications sequencer CSQ. This communications sequencer CSQ is a sequencer for performing signal transmission and reception processing (handshake processing) by a predetermined communications protocol (a communications protocol conforming to the communications macro block specification) to and from the macro block MB2. A transmission data signal from this communications sequencer CSQ (a transmission buffer TXB for testing) is input to the selector SEL1 as a test input signal TIN1 for MB2. A test output signal TOUT1 (TOUT) from the selector SEL2 is input to the communications sequencer CSQ (a test reception buffer RXB) as a reception data signal.

More specifically, the communications sequencer CSQ performs processing for transmitting a transmission data signal for the macro block MB2 through the selector SEL1 to MB2, in the second test mode that was described with reference to FIG. 3B. It also performs processing for receiving a reception data signal from MB2 through SEL2.

The communications sequencer CSQ comprises the test transmission buffer TXB and the test reception buffer RXB. TXB is a buffer (register) that stores the transmission data signal (TIN1) for MB2. RXB is a buffer. (register) that stores a reception data signal (TOUT1) from MB2. In other words, TXB stores a signal TI that has been input from the test input terminals TPI, as a transmission data signal. RXB stores a reception data signal from MB2 and outputs the stored reception data signal as a signal TO from the test output terminals TPO.

More specifically, the test transmission buffer TXB stores the transmission data signal TI that has been input from the test input terminals TPI. After the accumulation of the transmission data signal TI by TXB is complete (after a predetermined number of bytes of the transmission data signal have been stored), the communications sequencer CSQ performs processing to transmit the stored transmission data signal through the selector SEL1 to the macro block MB2. The communications sequencer CSQ also performs processing to receive the reception data signal TOUT1 from MB2, which has been set to loopback mode. The test reception buffer RXB stores the received reception data signal TOUT1 and outputs the stored reception data signal to the test output terminals TPO.

Note that the configuration could be such that only one of the transmission buffer TXB and the reception buffer RXB is provided in the test circuit TC. TXB and RXB could be provided within the communications sequencer CSQ or they could be provided externally.

The test circuit TC comprises a test buffer TSB. This TSB is a buffer (register) that stores a test input signal and a test output signal. More specifically, TSB stores the signal TI from the test input terminals TPI and outputs it as a test input signal TIN2 to the selector SEL1. TSB also stores a test output signal TOUT2 from the selector SEL2 and outputs it as the signal TO from the test output terminals TPO.

The test circuit TC also comprises a decoder DEC. This DEC outputs control signals to the various circuits of the test circuit, based on signals from the test terminals of the integrated circuit. More specifically, an address signal TAD for specifying addresses (register addresses) in the buffers TXB, RXB, and TSB and a write signal TWR and a read signal TRD for those buffers are input to the decoder DEC. In addition, test mode signals TMD1 and TMD2 (signals for switching between the first and second test modes and for switching between the test modes and the ordinary operating mode), a test clock signal TCK, and a test reset signal TRS are input thereto. The decoder DEC performs decoding processing based on these signals that are input from the test terminals, and generates control signals DCTL1 and DCTL2 for the communications sequencer CSQ (TXB, RXB) and the test buffer TSB and the select signals SS1 and SS2 for the selectors SEL1 and SEL2.

The communications sequencer CSQ (TXB, RXB) performs processing for storing the transmission data signal and the reception data signal in TXB and RXB and outputting the transmission data signal and the reception data signal from TXB and RXB, based on the control signal DCTL1 from the decoder DEC and the test clock signal TCK. The test buffer TSB performs processing for storing the test input signal and the test output signal in the TSB and outputting the test input signal and the test output signal from the TSB, based on the control signal DCTL2 from the decoder DEC and the test clock signal TCK.

When both of the signals TMD1 and TMD2 are at low level (a first level), the decoder DEC sets the select signal SS1 to high to cause the selection of the signals M2OUT to the selector SEL1 or set the signal SS1 to low to cause the selection of M2OUT to the selector SEL2. This turns the operating mode into an ordinary operating mode (a mode that is not a test mode).

When the signal TMD1 is at high (a second level), both the signals SS1 and SS2 are set to high to cause the selection of the signals M1OUT to SEL1 and the selection of the signal SQ to SEL2. This turns the operating mode to the first test mode for testing the macro block MB1.

When the signal TMD2 is at high, both the signals SS1 and SS2 are set to low to cause the selection of the signals TIN1 and TIN2 to SEL1 and also the signals M2OUT to SEL2. This turns the operating mode to the second test mode for testing the macro block MB2.

5.2 Buffer Configuration

An address map of the test transmission buffer TXB, the test reception buffer RXB, and the test buffer TSB is shown in FIG. 10.

In this embodiment, each of the transmission buffer TXB and the reception buffer RXB has a four-stage (generally speaking: a plurality of stages) buffer configuration (FIFO configuration). In other words, TxBuf0, TxBuf1, TxBuf2, and TxBuf3 in FIG. 10 correspond to the four stages of the transmission buffer TXB, and RxBuf0, RxBuf1, RxBuf2, and RxBuf3 correspond to the four stages of the reception buffer RXB. Each buffer in these four stages has an 8-bit configuration. In other words, TxBuf0[7] to TxBuf0[0] in FIG. 10 represent the bits of TxBuf0. The other buffers TxBuf1, TxBuf2, and TxBuf3 are similar. In addition, RxBuf0[7] to RxBuf0[0] represent the bits of RxBuf0. The other buffers RxBuf1, RxBuf2, RxBuf3 are similar.

In the embodiment shown in FIG. 10, if the addresses specified by the signal TAD from the terminal TPAD are in the range of 0x0 to 0x7 (hexadecimal notation), addresses in one or other of the transmission buffer TXB and the reception buffer RXB are specified. When the write signal TWR from the terminal TPWR becomes active, the transmission buffer TXB is specified, whereas when the read signal TRD from the terminal TPRD becomes active, the reception buffer RXB is specified.

When the addresses specified by the signal TAD are in the range of 0x8 to 0xF, on the other hand, addresses in the test buffer TSB are specified. The specification of read or write is done by the read signal TRD or the write signal TWR. Functions such as TXMODE, XCVRSELECT, TERMSELECT, . . . TXSTART are allocated to the bits of the test buffer TSB, as shown in FIG. 10.

For example, TXMODE is a bit that sets the transmission mode of the communications sequencer CSQ. If TXMODE is set to 0, the communications sequencer CSQ transmits four bytes (generally speaking: a plurality of bytes) of transmission data and stops. If TXMODE is set to 1, on the other hand, CSQ continues to transmit single bytes of transmission data that has been stored in TxBuf0.

In addition, bits such as XCVRSELECT, TERMSELECT, OPMODE1, . . . SUSPEND are bits for setting the input terminals (M2IN) of the macro block MB2 to a desired signal level (high level or low level). Bits such as MonRXACTIVE, MonRXERROR, MonLINESTATE1, and MonLINESTATE0 are bits for monitoring the signal level of the output terminals (M2OUT) of the macro block MB2.

TXSTART is a bit that instructs the start of transmission (transmission for testing) with respect to the communications sequencer CSQ, such that setting TXSTART to 1 starts the transmission. When the transmission is complete, TXSTART is cleared to 0. When TXMODE is 1, 0 is written to TXSTART to stop the transmission.

In an integrated circuit, an increase in the number of terminals leads to an increase in the fabrication cost. For that reason, it is desirable to reduce the number of test terminals to as few as possible. With this embodiment, the numbers of the test terminals TPI and TPO of FIG. 9 are reduced by the method described below.

Figure 11A:
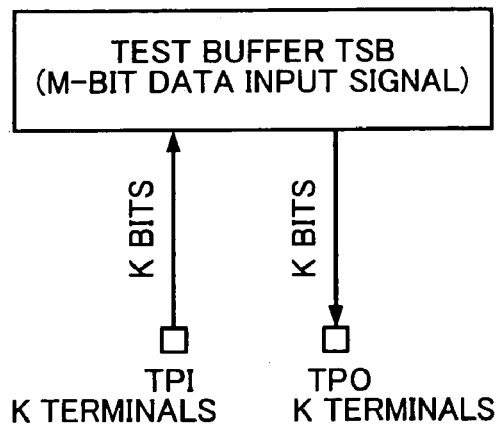
FIGS. 11A to 11D are illustrative of the test buffer, test transmission buffer, and test reception buffer of this embodiment.
Figure 11B:
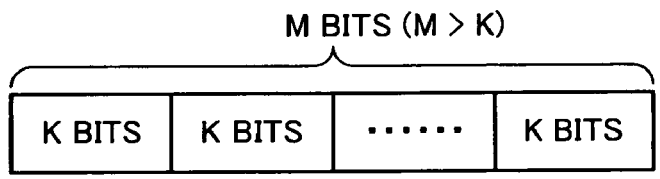

Assume that the input signal necessary for testing the macro block MB2 has M bits, by way of example. In such a case, the test buffer TSB of this embodiment receives these M bits of the test input signal by receiving K bits of the test input signal at a time (where M>K, and M and K are each a natural number or an integer greater than or equal to two) from a number K of the test input terminals TPI, as shown in FIGS. 11A and 11B. The stored signal is output to the selector SEL1 as the test input signal TIN2. This makes it possible to reduce the number of the test input terminals TPI to K terminals, although M terminals were necessary originally.

If all of the bits XCVRSELECT to SUSPEND of FIG. 10 were set to external terminals as TPI, by way of example, 12 (M) terminals would be necessary. In contrast thereto, the test buffer TSB takes in and stores the 12 bits (M bits) of the test input signals (XCVRSELECT to SUSPEND) by taking in 4 bits (K bits) of the test input signals at a time from TPI, as shown in FIGS. 11A and 11B. This means that the number of TPI terminals can be set to four, enabling a reduction in the number of terminals of the integrated circuit.

Figure 11C:
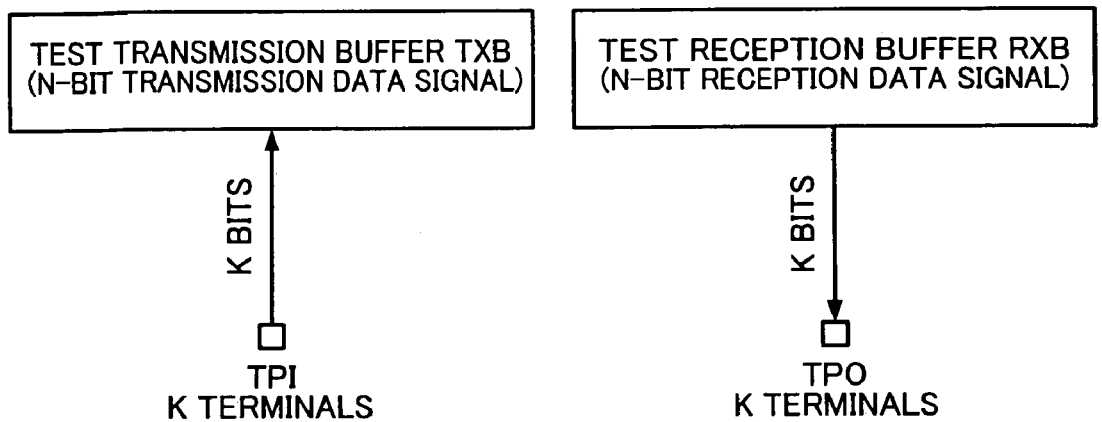
Figure 11D:
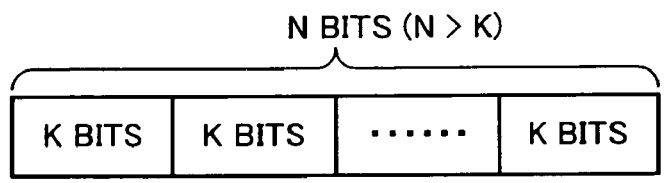

Assume that the number of bits of the transmission data signal and the reception data signal is N. In such a case, the test transmission buffer TXB of this embodiment receives and stores these N bits of the transmission data signal (test input signal) by receiving K bits of the transmission data signal at a time from K test input terminals TPI (where N>K, and N and K are each a natural number or an integer greater than or equal to two), as shown in FIGS. 11C and 11D. The stored signal is output to the selector SEL1 as the test input signal TIN1. This makes it possible to reduce the number of the test input terminals TPI to K terminals, from the N terminals that were necessary originally. Similarly, the test reception buffer RXB stores N bits of the reception data signal (the test output signal) from the macro block MB2 and outputs the stored reception data signal by outputting K bits of the reception data signal at a time to K test output terminals TPO, as shown in FIGS. 11C and 11D. This means that the number of TPO terminals can be reduced to K, although N terminals were necessary originally.

If all of the bits TxBuf0[7] to TxBuf0[0] of FIG. 10 were set to external terminals as TPI and all of the bits RxBuf0[7] to RxBuf0[0] were set to external terminals as TPO, the numbers of each of TPI and TPO would be eight (N terminals), making it necessary to have a total of 16 terminals. In contrast thereto, FIGS. 11C and 11D show that the transmission buffer TXB receives and stores the 8-bit (N-bit) transmission data signal by receiving four bits (K bits) of the transmission data signal at a time from TPI. Similarly, the reception buffer RXB outputs the 8-bit reception data signal by outputting four bits of the reception data signal at a time to TPO. This makes it possible to set the numbers of TPI and TPO terminals to four (K terminals) each, enabling a reduction in the number of terminals of the integrated circuit.

In addition, the four (K) terminals TPI and TPO are connected in common to the buffers TXB, RXB, and TSB, as shown in FIGS. 9 and 10, and the address signal TAD is used to specify the address of each bit in the buffers TXB, RXB, and TSB. This enables a further decrease in the number of terminals of the integrated circuit.

5.3 Communication Sequencer

Figure 12:
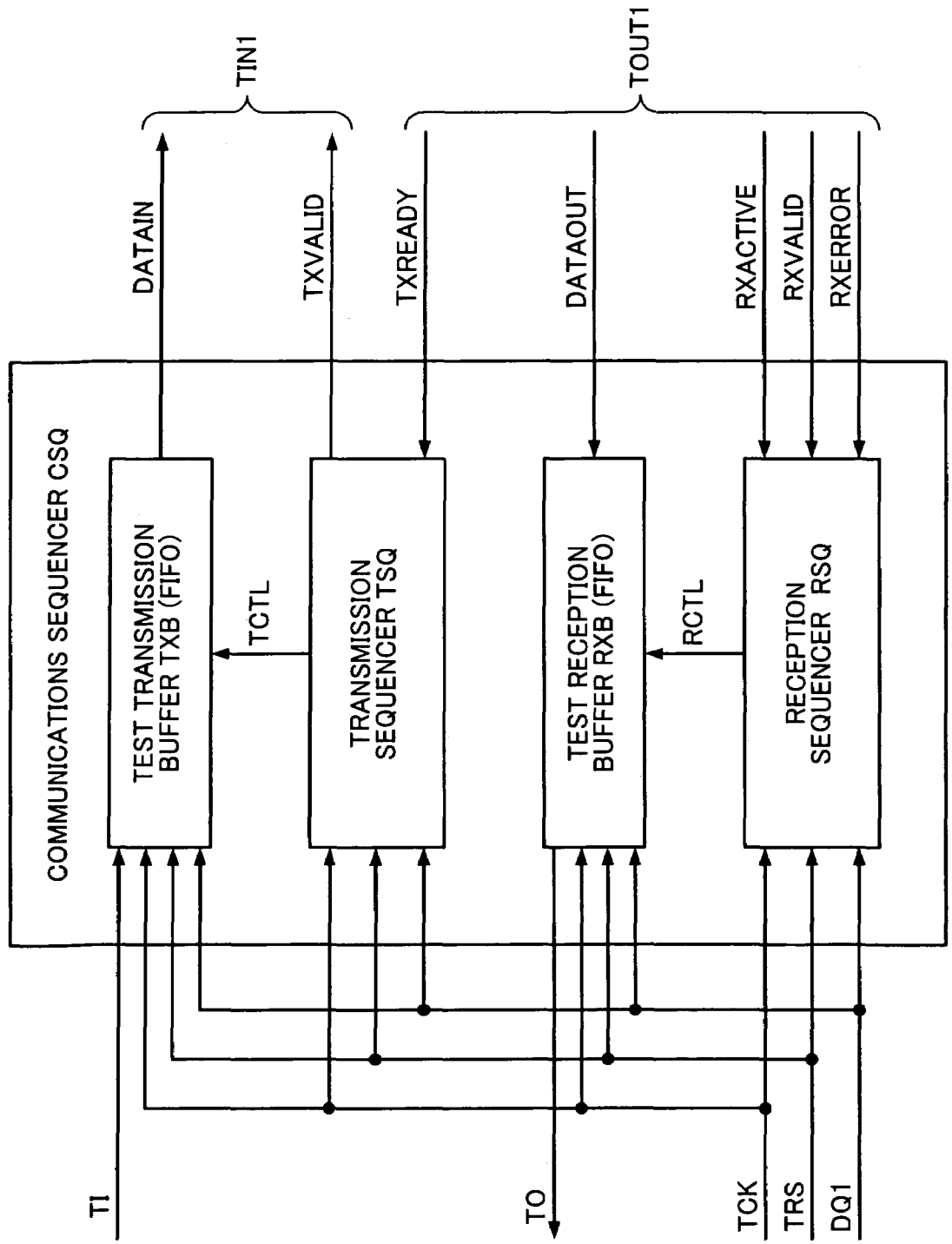
FIG. 12 shows an example of a configuration of a communications sequencer.

An example of the configuration of the communications sequencer CSQ is shown in FIG. 12. It should be noted, however, that the configuration of the communications sequencer CSQ is not limited to that shown in FIG. 12.

The communications sequencer CSQ comprises a transmission sequencer TSQ. This TSQ is a sequencer for implementing transmission processing with the macro block MB2 by handshake. More specifically, the transmission sequencer TSQ outputs a signal TXVALID (transmission start signal), which indicates that a transmission data signal DATAIN is valid, to the macro block MB2. MB2 views DATAIN during the period in which TXVALID is active as one packet. This signal TXVALID is output as the signal TIN1 through SEL1 to MB2, as shown in FIG. 9.

The transmission sequencer TSQ receives a signal TXREADY, which indicates that the buffering of DATAIN is complete, from MB2. This signal TXREADY is input from MB2 through SEL2 to the transmission sequencer TSQ as the signal TOUT1, as shown in FIG. 9.

The transmission sequencer TSQ uses a control signal TCTL (such as a transmission start signal) to control the transmission buffer TXB. More specifically, it controls the accumulation of the signal TI from the test input terminals TPI by the transmission buffer TXB. It also controls the output of the signal DATAIN to the macro block MB2 by the transmission buffer TXB. In this case, the signal TI is stored in the transmission buffer TXB of this embodiment at a clock frequency CF2 that is lower than a clock frequency CF1 (such as 60 MHz), during the output of the signal DATAIN. This makes it possible to use the lower clock frequency CF2 for the accumulation of the signal TI, to maintain some leeway. It is therefore possible to obtain stable test results with few variations, even when there are large parasitic capacitances in the test input terminals TPI.

The communications sequencer CSQ comprises a reception sequencer RSQ. This RSQ is a sequencer for implementing reception processing with the macro block MB2 by handshake. More specifically, the reception sequencer RSQ receives from the macro block MB2 a signal RXACTIVE that indicates that there is activity on the bus, a signal RXVALID that indicates that a reception data signal DATAOUT is valid, and a signal RXERROR that indicates that there was an error during packet reception. These signals RXACTIVE, RXVALID, and RXERROR are input from MB2 of FIG. 9, through SEL2, to the reception sequencer RSQ as the signal TOUT1.

The reception sequencer RSQ uses a control signal RCTL to control the test reception buffer RXB. More specifically, it controls the accumulation of the signal DATAOUT from the macro block MB2 by the reception buffer RXB. It also controls the output of the signal TO to the test output terminals TPO by the reception buffer RXB. In this case, the configuration of this embodiment is such that the signal TO is output at a clock frequency CF3 that is lower than the clock frequency CF1 (such as 60 MHz), during the accumulation of the signal DATAOUT (CF3 could also be the same as CF2). This makes it possible to use the lower clock frequency CF3 for the output of the signal TO, to maintain some leeway. It is therefore possible to obtain stable test results with few variations, even when there are large parasitic capacitances in the test output terminals TPO.

Figure 13:
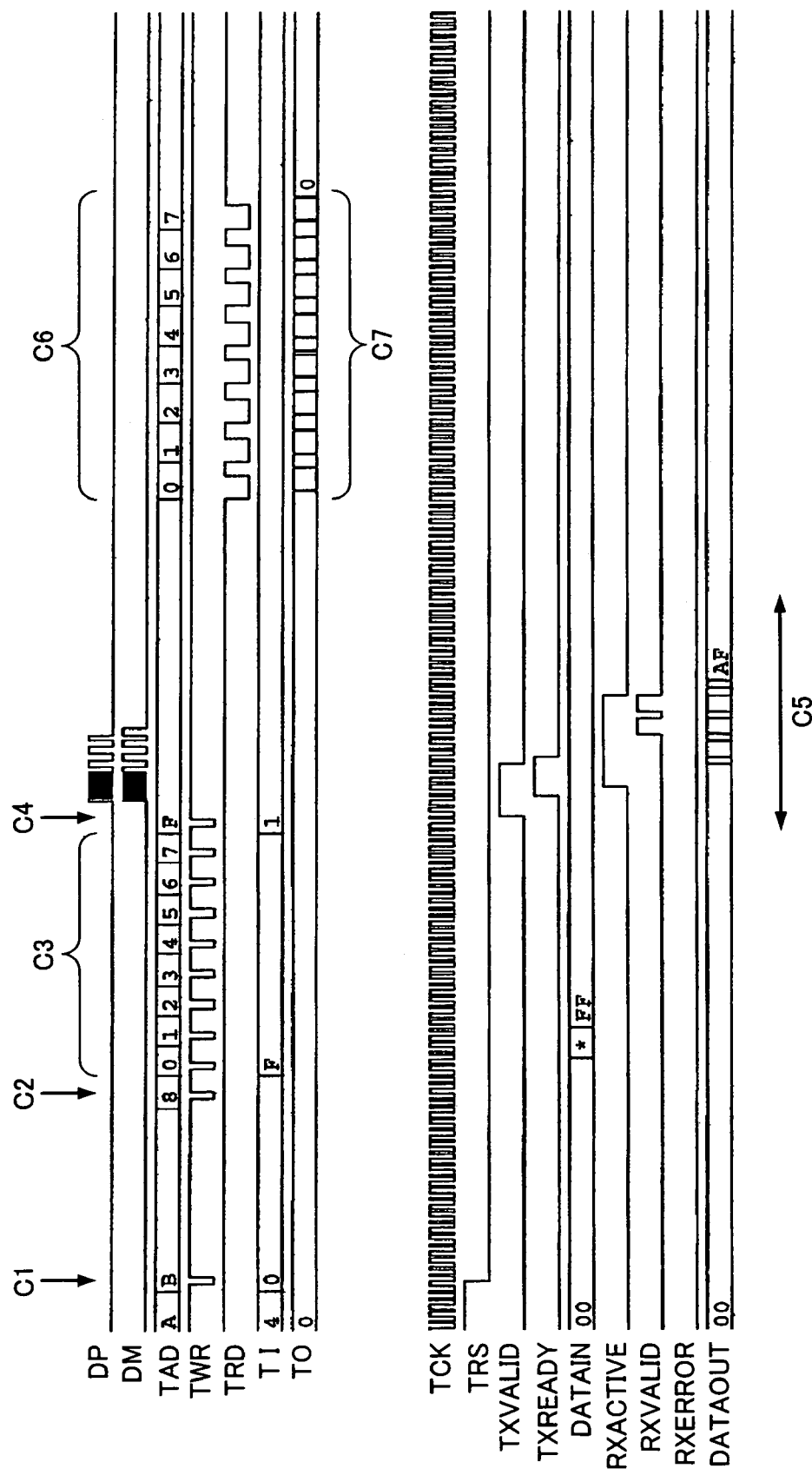
FIG. 13 is a waveform chart illustrating an operation of the test circuit and the communications sequencer.
Figure 14:
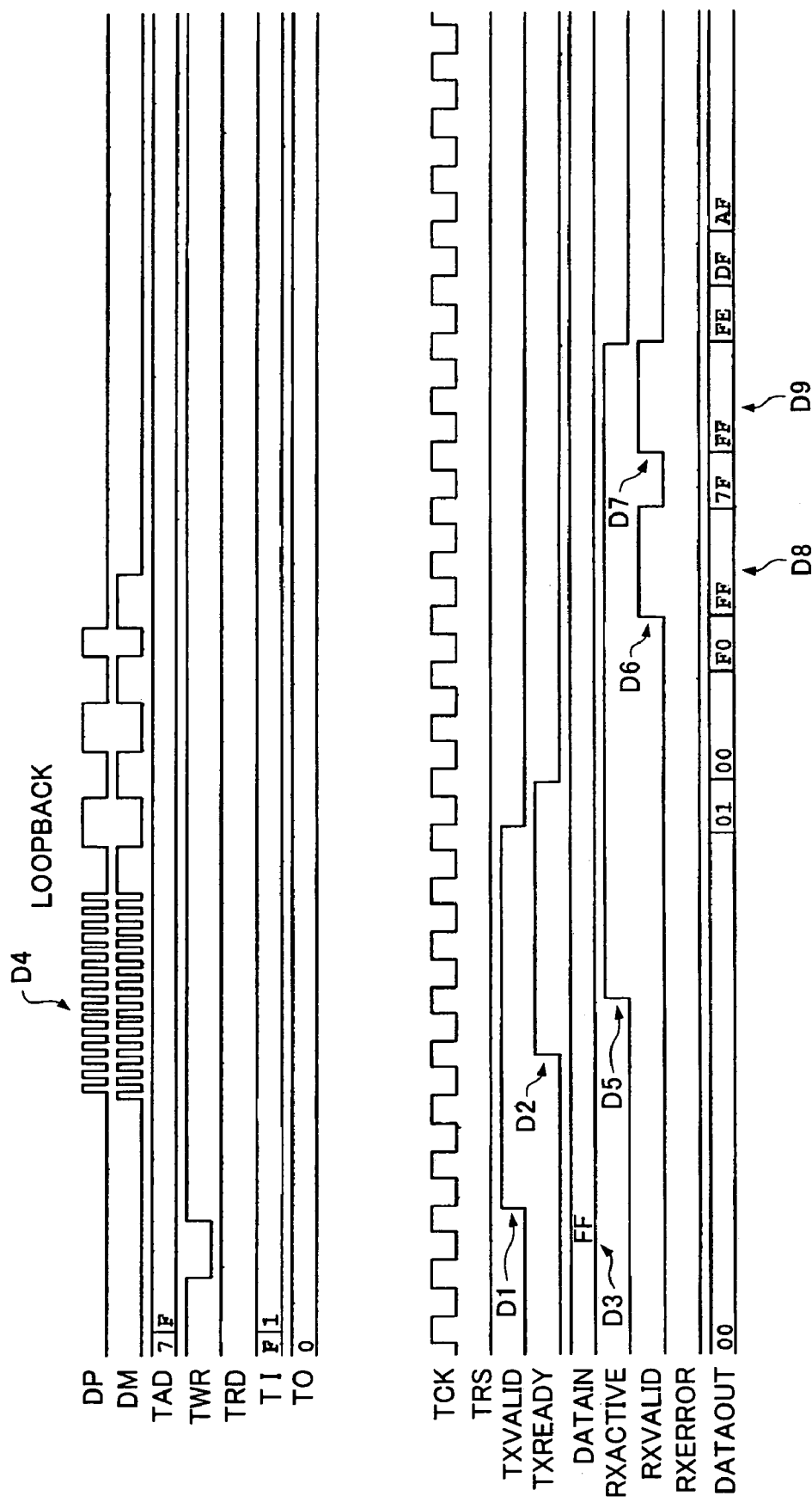
FIG. 14 is a waveform chart further illustrating the operation of the test circuit and the communications sequencer.

The description now turns to details of the operation of the test circuit TC and the communications sequencer CSQ, using the waveform charts shown in FIGS. 13 and 14.

First of all, all of the PLLSELECT, OSCENB, CLKSELECT1, and CLKSELECT0 signals of FIG. 10 are set to 0 by an external tester using the test terminals to set the address signal TAD to 0×B, the write signal TWR to active (low level), and also the signal TI to 0×0, as shown at C1. The tester then sets TXMODE of FIG. 10 to 0 by setting TAD to 0×8, TWR to active, and also TI to 0×0, as shown at C2. This sets the communications sequencer CSQ to a mode in which four bytes (a plurality of bytes) of the transmission data signal are transmitted sequentially.

The tester then writes 1 to all the bits of the four-stage buffers TxBuf0 to TxBuf3 of the transmission buffer TXB of FIG. 10, by setting the address signal TAD to 0×0 to 0×7, the write signal TWR to active, and also TI to 0×F, as shown at C3. In this case, the write processing is done at the lower clock frequency CF2. The tester then sets TXSTART of FIG. 10 to 1 by setting the address signal TAD to 0×F, the write signal TWR to active, and also the signal TI to 0×1, as shown at C4. This starts the automatic transmission processing by the communications sequencer CSQ.

FIG. 14 is a waveform chart showing the portion C5 of FIG. 13 enlarged. When the transmission processing of the communications sequencer CSQ (the transmission sequencer TSQ) starts, the signal TXVALID goes active at D1 in FIG. 14 and the macro block MB2 makes the signal TXREADY go active at D2. The transmission data signal DATAIN (FF) is transmitted to MB2 at D3.

When the macro block MB2 receives the transmission data signal DATAIN, transmission processing over the USB starts, using the differential signals DP and DM, as shown at D4. The macro block MB2 that has been set to loopback mode receives the transmission data signal that it has transmitted as a reception data signal in loopback mode. The macro block MB2 makes the signal RXACTIVE go active, as shown at D5. MB2 subsequently makes the signal RXVALID go active, as shown at D6 and D7. When that happens, the communications sequencer CSQ (the reception sequencer RSQ) that has received that signal stores the reception data signal DATAOUT (FF) from MB2 in the test reception buffer RXB, as shown at D8 and D9. The accumulation processing in this case is done at the higher the clock frequency CF1.

Subsequently, the tester causes the reception data signal TO that has been stored in the reception buffer RXB to be read by the tester through the test output terminals TPO, as shown at C7 in FIG. 13, by setting the address signal TAD to 0×0 to 0×7 and the read signal TRD to active, as shown at C6. The read-out processing in this case is done at the lower clock frequency CF3. The tester then performs comparison processing between the read-out values and expected values, and determines a pass if they match the expected values or a failure if they do not match. This completes the testing.

6. Macro Blocks

Figure 15:
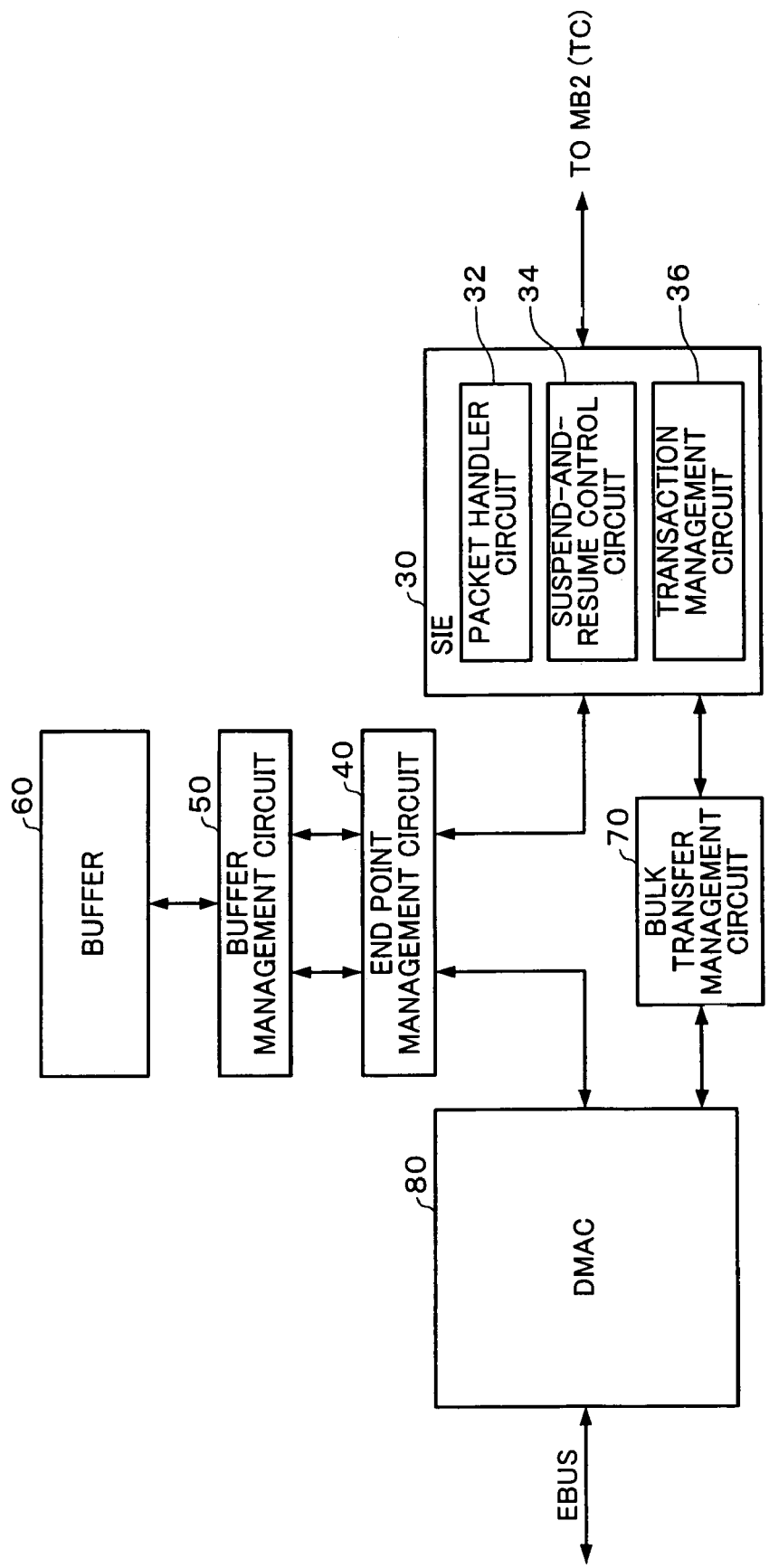
FIG. 15 shows an example of the macro block MB1.

An example of the macro block MB1 is shown in FIG. 15. Note that the macro block MB1 of this embodiment is not limited to the configuration shown in FIG. 15. The macro block MB1 of FIG. 15 comprises a serial interface engine (SIE) 30, an end point management circuit 40, a buffer management circuit 50, a buffer 60, a bulk transfer management circuit 70, and a direct memory access controller (DMAC) 80.

The SIE 30 is a circuit that performs various types of processing such as USB packet transfer processing. This SIE 30 (generally speaking: a first interface circuit) comprises a packet handler circuit 32, a suspend-and-resume control circuit 34, and a transaction management circuit 36. In this case, the packet handler circuit 32 is a circuit for assembling (generating) or analyzing packets formed of headers and data, and it generates and analyzes CRCs. The suspend-and-resume control circuit 34 is a circuit that performs sequence control during the suspension and resumption of processing. The transaction management circuit 36 is a circuit for managing transactions made up of token, data, handshake, and other packets. When a token packet is received, the transaction management circuit 36 confirms whether or not that packet has the device's own address and, if it does have that address, it performs processing to transfer data packets, then processing for transferring a handshake packet.

The end point management circuit 40 is a circuit for managing the end points that form entrances to the various storage areas of the buffer 60, and it comprises components such as registers (a register set) for storing attribute information for those end points.

The buffer management circuit 50 is a circuit for managing the buffer 60, and is formed of components such as RAM. More specifically, it generates write addresses or read addresses and performs processing to write data to the buffer 60 or read data from the buffer 60.

The buffer 60 (packet buffer or packet storage means) is designed to store data (packets) temporarily, for transfer through USB, and it has various functions such as compensating for any speed difference between the data transfer speed of USB (the first bus) and the data transfer speed of EBUS (a second bus). Note that EBUS is an external bus that connects together devices such as hard disk drives, optical disk drives, MPEG encoders, and MPEG decoders.

The bulk transfer management circuit 70 is a circuit for managing bulk transfers under USB. The DMAC 80 (generally speaking: a second interface circuit) is a DMA controller for performing DMA transfers to and from an external device through EBUS.

Figure 16:
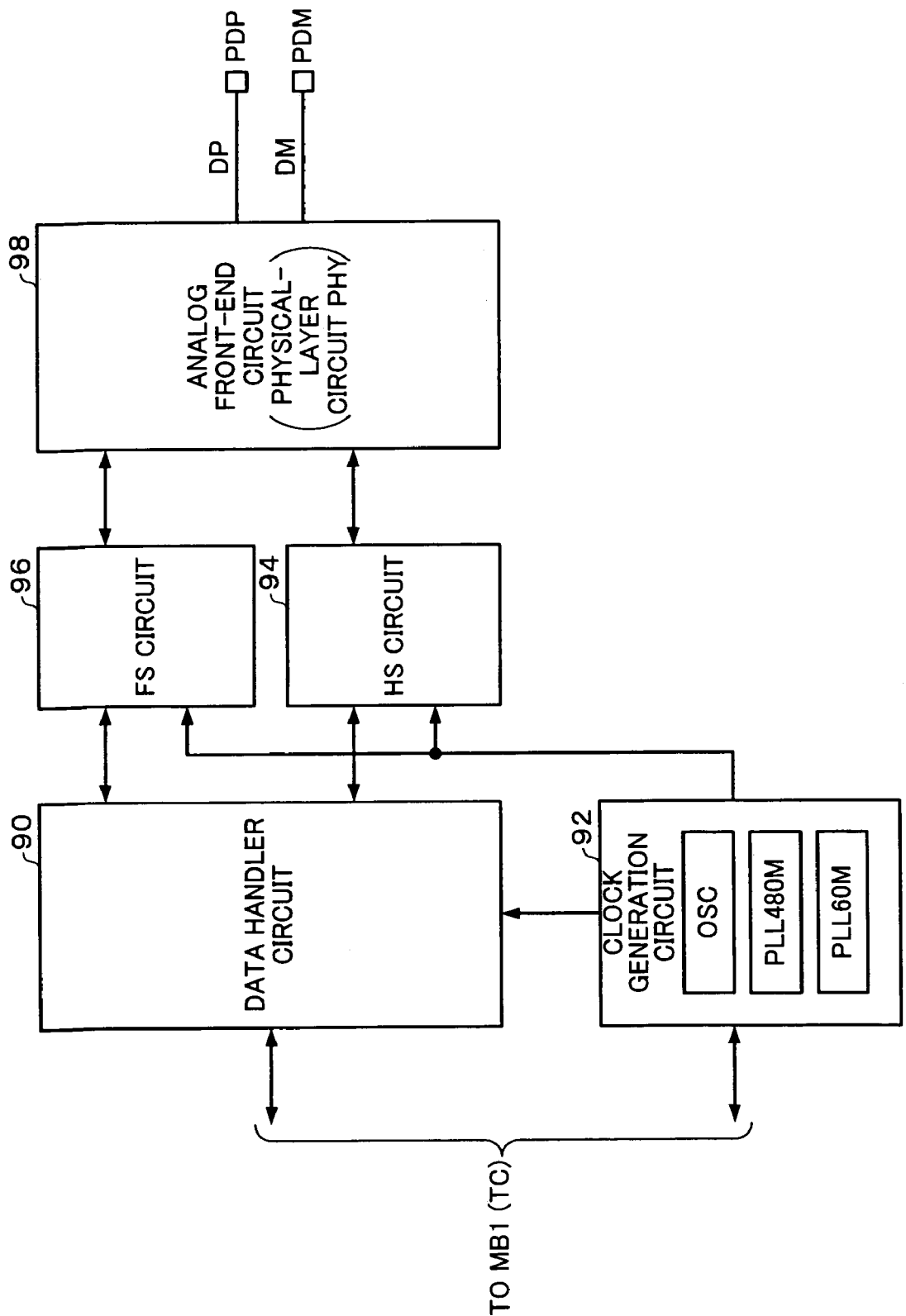
FIG. 16 shows an example of the macro block MB2.

An example of the macro block MB2 is shown in FIG. 16. Note that the macro block MB2 of this embodiment is not limited to the configuration shown in FIG. 16.

The macro block MB2 comprises a data handler circuit 90, a clock generation circuit 92, a high-speed (HS) circuit 94, and a full-speed (FS) circuit 96. These circuits are logic-level circuits. MB2 also comprises an analog front-end circuit 98 (transmission and reception circuit) that is a physical-layer circuit PHY.

The data handler circuit 90 performs various types of processing for transferring data in conformation with a standard such as USB 2.0. More specifically, during transmission, it performs processing such as attaching synchronization (SYNC), start of packet (SOP), and end of packet (EOP) codes to the data to be transmitted, and bit stuffing. During reception, on the other hand, it performs processing to detect and remove the SYNC, SOP, and EOP codes, and bit unstuffing. In addition, the data handler circuit 90 generates various timing signals for controlling the data transmission and reception.

With USB 2.0, an HS mode (generally speaking: a first transfer mode) and an FS mode (generally speaking: a second transfer mode) are defined. HS mode is a new transfer mode that has been defined by USB 2.0. FS mode is a transfer mode that was defined previously by the prior-art USB 1.1.

The clock generation circuit 92 is a circuit that generates clocks of various frequencies, such as the 480-MHz clock for HS and the 60-MHz system clock, and it comprises an oscillation circuit (OSC), a PLL 480M, and a PLL 60M.

In this case, the OSC generates a base clock in combination with other components such as an external oscillator, by way of example. The PLL 480M is a phase-locked loop (PLL) that generates the 480-MHz clock necessary for HS mode as well as the 60-MHz clock necessary for FS mode and the system clock, based on the base clock generated by the oscillation circuit (OSC). The PLL 60M is a PPL that generates the 60-MHz clock necessary for the system clock and FS mode, based on the base clock generated by the oscillation circuit (OSC).

The HS circuit 94 is a logic circuit for transmitting and receiving data in HS mode, which has a data transfer speed of 480 Mbps. The FS circuit 96 is a logic circuit for transmitting and receiving data in FS mode, which has a data transfer speed of 12 Mbps.

The analog front-end circuit 98 (transmission and reception circuit) is an analog circuit comprising drivers and receivers for transmission and reception in FS and HS modes, and it uses the differential signals DP and DM for transmission and reception processing. This analog front-end circuit 98 could comprise an HS-mode driver and receiver for transmission and reception in HS mode and an FS-mode driver and receiver for transmission and reception in FS mode.

Note that the present invention is not limited to this embodiment and thus various modifications thereto are possible within the scope of the invention laid out herein.

For example, the configurations of the test circuit and the first and second macro blocks are not limited to those described with reference to FIGS. 2, 7, 9, 15, and 16, and various modifications thereto are possible.

The selectors SEL1 and SEL2 described with reference to this embodiment are comprised within the range of the present invention, even when used in circuits equivalent to the dummy scan flip-flops DSFF, the communications sequencer CSQ, the test transmission buffer TXB, the test reception buffer RXB, and the test buffer TSB.

In addition, terminology (such as: UTMI, SIE, DMAC, HS mode, FS mode, three items, four stages, and four bytes) that is derived from generic terminology defined within this document (such as: communications macro block specification, first interface circuit, second interface circuit, first transfer mode, second transfer mode, (I−J) items, plurality of stages, and plurality of bytes) could be replaced by other terminology used within this document.

Part of requirements of a claim of the present invention could be omitted from a dependent claim which depends on that claim. Moreover, part of requirements of any independent claim of the present invention could be made to depend on any other independent claim.

The specification discloses the following matters about the configuration of the embodiments described above.

According to one embodiment of the present invention, there is provided a test circuit for an integrated circuit comprising a plurality of macro blocks, the test circuit comprising: a first selector having a first input to which an output signal from a first macro block is input and a second input to which a test input signal for a second macro block is input; and a second selector having a first input to which an output signal from the first selector is input and a second input to which an output signal from the second macro block is input, wherein during a first test mode for testing the first macro block, the first selector outputs to the first input of the second selector the output signal that has been input from the first macro block to the first input of the first selector, and the second selector outputs to the first macro block the output signal that has been input from the first selector to the first input of the second selector, and wherein during a second test mode for testing the second macro block, the first selector outputs to the second macro block the test input signal for the second macro block that has been input to the second input of the first selector, and the second selector outputs the output signal from the second macro block that has been input to the second input of the second selector, as a test output signal for the second macro block.

With this embodiment, the output signals from the first macro block are output to the first macro block through the first and second selectors in the first test mode. On the other hand, in the second test mode, a test input signal for the second macro block is output to the second macro block, and the output signals from the second macro block are output as test output signals for the second macro block.

This configuration makes it possible to detect faults in the connecting portion between the first macro block and the test circuit by using the first test mode. It also makes it possible to detect faults in the connecting portion between the test circuit and the second macro block by using the second test mode. This enables the detection of faults in the connecting portions between the first and second macro blocks.

Note that in an ordinary operating mode (a mode that is not the first and second test modes), the configuration could be such that the first selector outputs to the second macro block an output signal from the first macro block that has been input to the first input thereof and the second selector outputs to the first macro block an output signal from the second macro block that has been input to the second input thereof.

In addition, the test input signal for the second macro block could be input from test input terminals, or it could be input from another circuit. Similarly, the test output signal for the second macro block could be output to test output terminals, or it could be output to another circuit. The output signal from the first selector could be input to the first input of the second selector through another circuit. Furthermore, the inputs provided for the first and second selectors are not limited to the first and second inputs; it is equally possible to have three or more inputs.

In this configuration, a scan path may be set for the test circuit together with the first macro block, and the first test mode may be a scan mode in which testing is performed by a scan method that uses the scan path.

In this case, the setting of the scan path means the setting of a path from one or more scan-in terminals, through a scan flip-flop (scan circuit), to one or more scan-out terminals.

In this configuration, when the number of the output signals from the first macro block to the test circuit is I and the number of input signals from the test circuit to the first macro block is J (where I>J, and I and J are each a natural number or an integer greater than or equal to two), the test circuit further may comprise (I−J) dummy scan flip-flops to hold (I−J) output signals among the I output signals from the first selector, and the dummy scan flip-flops may output the held output signals through the scan path in the scan mode.

This configuration makes it possible to check efficiently for wiring defects or the like in the (I−J) output signals (Jth to Ith output signals) among the I output signals (first to Ith output signals) from the first macro block.

In this configuration, the test circuit may further comprise: a test buffer which stores an M-bit test input signal for the second macro block by receiving a K-bit test input signal at a time via K test input terminals (where M>K, and M and K are integers greater than or equal to two), and outputs the stored test input signal to the first selector.

Note that test buffer could also output K bits at a time of a stored L-bit test output signal for the second macro block, K bits at a time (where L>K, L is an integer greater than or equal to two) via K test output terminals.

In this configuration, the second macro block may be a macro block that comprises a physical-layer circuit for data communications, the test circuit may comprise a communications sequencer for performing transmission and reception processing to and from the second macro block by a predetermined communications protocol, and in the second test mode, the communications sequencer may operate to perform processing to transmit a transmission data signal to the second macro block through the first selector, and processing to receive a reception data signal from the second macro block through the second selector.

This configuration makes it possible to improve the test efficiency because the transmission and reception processing to and from the second macro block is done automatically by the communications sequencer. Note that the communications sequencer could be provided with only one of the transmission processing function and the reception processing function.

In this configuration, the test circuit may further comprise: a test transmission buffer which stores the transmission data signal to the second macro block; and a test reception buffer which stores the reception data signal from the second macro block.

This configuration also makes it possible to store the transmission data signal and the reception data signal at a lower clock frequency, by way of example, enabling the implementation of more reliable testing. Note that just one of the test transmission buffer and the test reception buffer could be provided.

In this configuration, the test transmission buffer may store a transmission data signal that is input from a test input terminal, the communications sequencer may perform processing to transmit the stored transmission data signal through the first selector to the second macro block, after the storage of the transmission data signal by the test transmission buffer, and may perform processing to receive the reception data signal from the second macro block that has been set to loopback mode, and the test reception buffer may store the received reception data signal and may output the stored reception data signal to the test output terminal.

This configuration makes it possible to-improve the test efficiency, enabling to perform automatically a sequence of transmission and reception processing of transmitting the transmission data signal of the test transmission buffer to the second macro block and receiving the reception data signal from the second macro block in the test reception buffer.

In this configuration, the test transmission buffer may receive an N-bit transmission data signal for the second macro block by receiving a K-bit transmission data signal at a time via K test input terminals (where N>K, and N and K are integers greater than or equal to two), and the test reception buffer may store an N-bit reception data signal from the second macro block and may output the stored reception data signal by outputting a K-bit reception data signal at a time to K test output terminals.

According to another embodiment of the present invention, there is provided an integrated circuit comprising: one of the above described test circuits, the first macro block, and the second macro block.

Note that the integrated circuit could comprise macro blocks other than the first and second macro blocks.

According to further embodiment of the present invention, there is provided a test method that uses a test circuit comprising a first selector having a first input to which an output signal from a first macro block is input and a second input to which a test input signal for a second macro block is input, and a second selector having a first input to which an output signal from the first selector is input and a second input to which an output signal from the second macro block is input, wherein during a first test mode for testing the first macro block, the output signal from the first macro block that has been input to the first input of the first selector is output to the first input of the second selector, and the output signal from the first selector that has been input to the first input of the second selector is output to the first macro block, and wherein during a second test mode for testing the second macro block, the test input signal for the second macro block that has been input to the second input of the first selector is output to the second macro block, and the output signal from the second macro block that has been input to the second input of the second selector is output as a test output signal for the second macro block.

In this configuration, a scan path may be set for the test circuit together with the first macro block, and testing may be performed in scan mode by a scan method that uses the scan path, in the first test mode.

In this configuration, when the number of the output signals from the first macro block to the test circuit is I and the number of input signals from the test circuit to the first macro block is J (where I>J, I and J are integers greater than or equal to two), (I–J) output signals among the I output signals from the first selector may be held, and the held output signals may be output through the scan path in the scan mode.

In this configuration, the test circuit may comprise a communications sequencer for performing transmission and reception processing to and from the second macro block by a predetermined communications protocol, and in the second test mode, the communications sequencer may be used to transmit a transmission data signal to the second macro block through the first selector and receive a reception data signal from the second macro block through the second selector.

What is claimed is:

1. A test circuit for an integrated circuit comprising a plurality of macro blocks, the test circuit comprising:

a first selector having a first input to which an output signal from a first macro block is input and a second input to which a test input signal for a second macro block is input; and a second selector having a first input to which an output signal from the first selector is input and a second input to which an output signal from the second macro block is input, wherein during a first test mode for testing the first macro block, the first selector outputs to the first input of the second selector the output signal that has been input from the first macro block to the first input of the first selector, and the second selector outputs to the first macro block the output signal that has been input from the first selector to the first input of the second selector, and wherein during a second test mode for testing the second macro block, the first selector outputs to the second macro block the test input signal for the second macro block that has been input to the second input of the first selector, and the second selector outputs the output signal from the second macro block that has been input to the second input of the second selector, as a test output signal for the second macro block.

2. The test circuit as defined in claim 1, wherein a scan path is set for the test circuit together with the first macro block, and wherein the first test mode is a scan mode in which testing is performed by a scan method that uses the scan path.

3. The test circuit as defined in claim 2, wherein, when the number of the output signals from the first macro block to the test circuit is I and the number of input signals from the test circuit to the first macro block is J (where I>J, and I and J are integers greater than or equal to two), the test circuit further comprises (I–J) dummy scan flip-flops to hold (I–J) output signals among the I output signals from the first selector, and wherein the dummy scan flip-flops output the held output signals through the scan path in the scan mode.

4. The test circuit as defined in claim 1, further comprising:

a test buffer which stores an M-bit test input signal for the second macro block by receiving a K-bit test input signal at a time via K test input terminals (where M>K, and M and K are integers greater than or equal to two), and outputs the stored test input signal to the first selector.

5. The test circuit as defined in claim 1, wherein the second macro block is a macro block that comprises a physical-layer circuit for data communications, wherein the test circuit comprises a communications sequencer for performing transmission and reception processing to and from the second macro block by a predetermined communications protocol, and wherein in the second test mode, the communications sequencer operates to perform processing to transmit a transmission data signal to the second macro block through the first selector, and processing to receive a reception data signal from the second macro block through the second selector.

6. The test circuit as defined in claim 5, further comprising:
- a test transmission buffer which stores the transmission data signal to the second macro block; and
- a test reception buffer which stores the reception data signal from the second macro block.

7. The test circuit as defined in claim 6,
wherein the test transmission buffer stores a transmission data signal that is input from a test input terminal,
wherein the communications sequencer performs processing to transmit the stored transmission data signal through the first selector to the second macro block, after the storage of the transmission data signal by the test transmission buffer, and also performs processing to receive the reception data signal from the second macro block that has been set to loopback mode, and
wherein the test reception buffer stores the received reception data signal and outputs the stored reception data signal to the test output terminal.

8. The test circuit as defined in claim 6,
wherein the test transmission buffer receives an N-bit transmission data signal for the second macro block by receiving a K-bit transmission data signal at a time via K test input terminals (where N>K, and N and K are integers greater than or equal to two), and
wherein the test reception buffer stores an N-bit reception data signal from the second macro block and outputs the stored reception data signal by outputting a K-bit reception data signal at a time to K test output terminals.

9. A test method that uses a test circuit comprising a first selector having a first input to which an output signal from a first macro block is input and a second input to which a test input signal for a second macro block is input, and a second selector having a first input to which an output signal from the first selector is input and a second input to which an output signal from the second macro block is input,
wherein during a first test mode for testing the first macro block, the output signal from the first macro block that has been input to the first input of the first selector is output to the first input of the second selector, and the output signal from the first selector that has been input to the first input of the second selector is output to the first macro block, and
wherein during a second test mode for testing the second macro block, the test input signal for the second macro block that has been input to the second input of the first selector is output to the second macro block, and the output signal from the second macro block that has been input to the second input of the second selector is output as a test output signal for the second macro block.

10. The test method as defined in claim 9,
wherein a scan path is set for the test circuit together with the first macro block, and
wherein testing is performed in scan mode by a scan method that uses the scan path, in the first test mode.

11. The test method as defined in claim 10,
wherein, when the number of the output signals from the first macro block to the test circuit is I and the number of input signals from the test circuit to the first macro block is J (where I>J, I and J are integers greater than or equal to two), (I–J) output signals among the I output signals from the first selector are held, and
wherein the held output signals are output through the scan path in the scan mode.

12. The test method as defined in claim 9,
wherein the test circuit comprises a communications sequencer for performing transmission and reception processing to and from the second macro block by a predetermined communications protocol, and
wherein in the second test mode, the communications sequencer is used to transmit a transmission data signal to the second macro block through the first selector and receive a reception data signal from the second macro block through the second selector.

13. An integrated circuit comprising a first macro block, a second macro block, and a test circuit, where the test circuit comprises:
- a first selector having a first input to which an output signal from the first macro block is input and a second input to which a test input signal for the second macro block is input; and
- a second selector having a first input to which an output signal from the first selector is input and a second input to which an output signal from the second macro block is input, wherein during a first test mode for testing the first macro block, the first selector outputs to the first input of the second selector the output signal that has been input from the first macro block to the first input of the first selector, and the second selector outputs to the first macro block the output signal that has been input from the first selector to the first input of the second selector, and
wherein during a second test mode for testing the second macro block, the first selector outputs to the second macro block the test input signal for the second macro block that has been input to the second input of the first selector, and the second selector outputs the output signal from the second macro block that has been input to the second input of the second selector, as a test output signal for the second macro block.

* * * * *